(12) United States Patent
Moore et al.

(10) Patent No.: US 11,764,204 B2
(45) Date of Patent: Sep. 19, 2023

(54) ELECTROSTATIC DISCHARGE AND OVERDRIVE PROTECTION CIRCUITRY

(71) Applicant: Analog Devices, Inc., Norwood, MA (US)

(72) Inventors: Ralph D. Moore, Greensboro, NC (US); Franklin M. Murden, Roan Mountain, TN (US); Peter Delos, Greensboro, NC (US); Srivatsan Parthasarathy, Acton, MA (US); Javier Salcedo, North Billerica, MA (US); John Guido, Glendale, AZ (US)

(73) Assignee: Analog Devices, Inc., Wilmington, MA (US)

( * ) Notice: Subject to any disclaimer, the term of this patent is extended or adjusted under 35 U.S.C. 154(b) by 353 days.

(21) Appl. No.: 16/905,687

(22) Filed: Jun. 18, 2020

(65) Prior Publication Data

US 2021/0398968 A1    Dec. 23, 2021

(51) Int. Cl.
*H01L 27/02* (2006.01)
*H02H 9/04* (2006.01)

(52) U.S. Cl.
CPC ......... *H01L 27/0248* (2013.01); *H02H 9/046* (2013.01)

(58) Field of Classification Search
CPC ...... H01L 27/0248–0266; H02H 9/046; H02H 9/04; H02H 9/043
See application file for complete search history.

(56) References Cited

U.S. PATENT DOCUMENTS

| | | | |
|---|---|---|---|
| 5,369,309 A | 11/1994 | Bacrania et al. | |
| 6,690,555 B1* | 2/2004 | Pasqualini | H03K 17/08142 361/91.1 |
| 9,864,386 B2 | 1/2018 | Kurnaz et al. | |
| 2002/0038631 A1* | 4/2002 | Sumiya | C23C 16/507 156/345.43 |
| 2004/0045673 A1* | 3/2004 | Yasui | H01J 37/32174 156/345.41 |
| 2005/0180076 A1* | 8/2005 | Saito | H01L 27/0266 361/91.1 |
| 2006/0158802 A1* | 7/2006 | Kawashimo | H03F 1/52 361/56 |
| 2011/0121859 A1* | 5/2011 | Petrofsky | H03K 3/021 326/62 |
| 2014/0321017 A1* | 10/2014 | Kim | H01L 27/0629 361/88 |
| 2016/0006369 A1* | 1/2016 | Zoescher | G06K 19/0701 455/73 |

(Continued)

*Primary Examiner* — Khaja Ahmad
(74) *Attorney, Agent, or Firm* — Knobbe, Martens, Olson & Bear, LLP

(57) ABSTRACT

Herein disclosed are systems and circuitry for protecting against overdrive and electrostatic discharge. For example, protection circuitry may include field effect transistors to discharge overdrive outside of an operational voltage range of a circuit in some embodiments to prevent damage to the circuit. Further, the protection circuitry may utilize diode features inherent in the field effect transistors to protect against electrostatic discharge in some embodiments. The circuitry may be implemented in radio frequency sampling analog-to-digital converters and can provide for single-ended signal input and/or output for the analog-to-digital converters.

20 Claims, 10 Drawing Sheets

(56) References Cited

U.S. PATENT DOCUMENTS

| | | | |
|---|---|---|---|
| 2016/0079977 A1* | 3/2016 | Zhou | H03K 19/00315 |
| | | | 326/112 |
| 2018/0081383 A1 | 3/2018 | Kurnaz et al. | |
| 2019/0148355 A1* | 5/2019 | Chang | H01L 27/0629 |
| | | | 257/506 |

* cited by examiner

ELECTROSTATIC DISCHARGE AND OVERDRIVE PROTECTION CIRCUITRY

FIELD OF THE DISCLOSURE

This disclosure relates in general to the field of circuit protection, and more particularly, though not exclusively, to systems and circuitry for protection of circuits from excessive input voltages.

BACKGROUND

Electrical circuits can be designed for certain voltage ranges. Voltages applied to the circuits outside of designed voltage ranges can cause damage to the circuits or portions thereof. Often overdrive outside the designed voltage ranges occur at an input, an output, and/or a combined input and output of the circuit. Further, electrostatic discharges can be applied to the circuitry via the input, the output, and/or the combined input and output of the circuit.

To protect from overdrive, circuitry can be added to the circuits to discharge the overdrive. Some examples of legacy protection circuitry that can be implemented in circuits include a comparator to turn on a differential switch to discharge the overdrive. This comparator and differential switch arrangement may present lag time for turn on of the protection, may be effective only for differential signals, and may present parasitic loading to signals within the circuit. For example, legacy protection circuitry for radio frequency sampling analog-to-digital converters have differential input overdrive clamps to dissipate the overdrive, where the differential input overdrive clamps are effective only for differential signals. Further, the legacy protection circuitry may have voltage level variable capacitance (also known as varactance), which can cause nonlinearity responses in signals received by the circuit.

To protect from electrostatic discharges, circuitry can be added to the circuits to discharge the electrostatic discharges. Some examples of legacy protection circuitry that can be implemented in circuits include discrete electrostatic discharge diodes coupled to rails of the circuits to discharge the electrostatic discharges. The discrete electrostatic discharge diodes can present parasitic loading to signals within the circuit.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
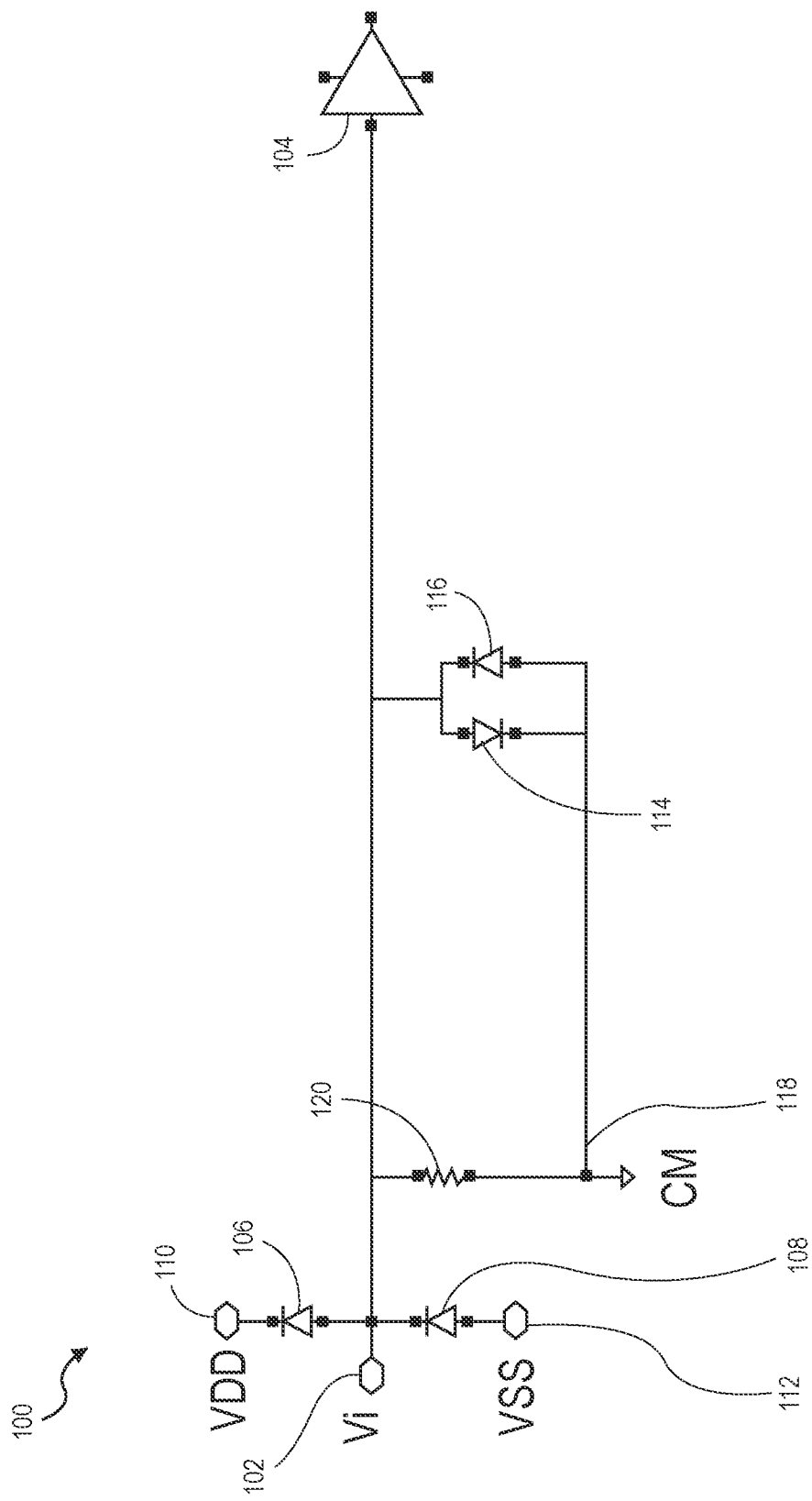
FIG. 1 illustrates an example protection circuitry, according to various embodiments of the disclosure.

Herein disclosed are systems and circuitry for protecting against overdrive and electrostatic discharge. For example, protection circuitry may include field effect transistors to discharge overdrive outside of an operational voltage range of a circuit in some embodiments to prevent damage to the circuit. Further, the protection circuitry may utilize diode features inherent in the field effect transistors to protect against electrostatic discharge in some embodiments. The circuitry may be implemented in radio frequency sampling analog-to-digital converters and can provide for single-ended signal input and/or output for the analog-to-digital converters.

In some embodiments, input/output protection circuitry for a device is disclosed. The input/output protection circuitry may include a first transistor to be coupled between an input/output of the device and a common mode node of the device, the common mode node to be set to a common mode voltage for the device, wherein the first transistor is to conduct current between the input/output and the common mode node when a voltage on the input/output exceeds a first threshold voltage. The input/output protection circuitry may further include a second transistor to be coupled between the input/output and the common mode node, wherein the second transistor is to conduct current between the input/output and the common mode node when the voltage on the input/output is below a second threshold voltage.

In some embodiments, a radio frequency (RF) circuit is disclosed. The RF circuit may include electrostatic discharge protection circuitry coupled to an input/output of the RF circuit, the electrostatic discharge protection circuitry to protect the RF circuit from electrostatic discharge on the input/output. The RF circuit may further include overdrive protection circuitry coupled to the input/output, the overdrive protection circuitry to protect the RF circuit from overdrive on the input/output. The overdrive protection circuitry may include a first transistor coupled to the input/output, the first transistor to discharge a positive overdrive on the input/output when a voltage applied to the input/output exceeds a first threshold voltage, and a second transistor coupled to the input/output, the second transistor to discharge a negative overdrive on the input/output when the voltage applied to the input/output is below a second threshold voltage.

In some embodiments, differential protection circuitry for a device is disclosed. The differential protection circuitry may include a first transistor coupled between a positive input coupled to a positive component of a differential input and a negative input coupled to a negative component of the differential input, the first transistor to couple the positive input to the negative input when a voltage at the positive input exceeds a voltage at the negative input by a threshold voltage of the first transistor. The differential protection circuitry may further include a second transistor coupled between the positive input and the negative input, the second transistor to couple the positive input to the negative input when the voltage at the negative input exceeds the voltage at the positive input by a threshold voltage of the second transistor.

DETAILED DESCRIPTION

The following disclosure describes protection circuitry for an input/output of a circuit of a system to protect against overdrive and/or electrostatic discharge for the circuit. The protection circuitry may utilize diode elements coupled to the input/output to discharge the overdrive. Utilizing the diode elements may reduce parasitic loading due to the protection circuitry and reduce lag time for engagement of the protection as compared to legacy protection circuitry. Further, the utilization of the diode elements may allow for single-ended signals or differential signals. This can be useful for systems that previously required differentials signals for legacy protection circuitry, such as radio frequency (RF) sampling analog-to-digital converters (ADCs).

In some embodiments, the diode elements utilized for discharging the overdrive may comprise transistors. For example, the transistors may comprise field effect transistors (FETs) or bipolar junction transistors (BJTs). In addition to be utilized for discharging the overdrive, diode features of the transistors may be utilized for electrostatic discharge (ESD) protection. Utilizing the diode features of the transistors rather than discrete diodes can reduce parasitic loading that can be caused by the discrete diodes.

For brevity, this disclosure illustrates and describes embodiments with FETs. However, it should be understood that the FETs illustrated may be replaced with other transistors, such as BJTs in other embodiments. Further, it should be understood that the features of the FETs described herein should be understood to be similar features of the other transistors that replace the FETs in other embodiments. For example, references to the source of the FET may be understood to refer to a collector of a BJT, references to the gate of the FET may be understood to refer to a base of the BJT, references to the drain of the FET may be understood to refer to an emitter of the BJT, and references to the back gate of the FET may be understood to refer to a back gate of the BJT in embodiments where the FETs are replaced by BJTs. Further, references to p-channel FETs may be understood to refer to PNP BJTs, and references to n-channel FETs may be understood to refer to NPN BJTs in embodiments where the FETs are replaced by BJTs.

It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 illustrates an example protection circuitry 100, according to various embodiments of the disclosure. The protection circuitry 100 shown is implemented in an input to a system. In particular, the protection circuitry 100 illustrated shows an input 102 of a system with a buffer 104 at an output of the protection circuitry 100 that can couple to the rest of the circuit of the system. It should be understood that the protection circuitry 100 can be implemented at an input of a system, an output of a system, or a combined input and output of a system. As used herein, input/output may refer to an input of a system, an output of a system, or a combined input and output of a system.

The protection circuitry 100 may include discrete diodes to provide electrostatic discharge protection for the circuit. In particular, the protection circuitry includes a first diode 106 and a second diode 108 explicitly utilized for electrostatic discharge protection. The first diode 106 may be coupled between the input 102 of the system and a positive voltage rail 110 of the system. The first diode 106 may conduct current when a voltage at the input 102 exceeds a voltage of the positive voltage rail 110 by a threshold voltage of the first diode 106. For example, when a positive electrostatic discharge is applied to the input 102 and exceeds the voltage of the positive voltage rail 110, the first diode 106 may conduct and discharge the positive electrostatic discharge to the positive voltage rail 110 protecting the circuit from the positive electrostatic discharge.

The second diode 108 may be coupled between the input 102 and a negative voltage rail 112 of the system. The second diode 108 may conduct current when a voltage at the input 102 is below a voltage of the negative voltage rail 112 by a threshold voltage of the second diode 108. For example, when a negative electrostatic discharge is applied to the input 102 and is below the voltage of the negative voltage rail 112, the second diode 108 may conduct and discharge the negative electrostatic discharge to the negative voltage rail 112 protecting the circuit from the negative electrostatic discharge.

The protection circuitry 100 may further include diode elements to provide overdrive protection. For example, overdrive may occur when excess signal is applied to the input 102, such as the signal being too high of a positive voltage or too low of a negative voltage. The overdrive, if not dissipated, can cause damage to the circuit. The diode elements may form a clamp mechanism to clamp a voltage at the input 102 to within an operational range of the circuit. Utilization of the diode elements may present lower parasitic loading, less lag time to engage, and less nonlinearity. Additionally, the utilization of the diode elements may provide for single-ended signal inputs and differential signal inputs.

In the illustrated embodiment, the diode elements comprise a first diode 114 and a second diode 116. The first diode 114 and the second diode 116 may be coupled between the input 102 and a common mode node 118 of the circuit. The common mode node 118 may be set to a common mode voltage of the circuit. In the illustrated embodiment, the common mode node 118 is shown being set to ground, although it should be understood that the common mode node 118 may be set to other common node voltages in other embodiments.

The first diode 114 may have an anode of the first diode 114 coupled to the input 102 and a cathode of the first diode 114 coupled to the common mode node 118. The first diode 114 may conduct when a voltage at the input 102 is greater than a voltage of the common mode node 118 by at least a threshold voltage of the first diode 114. Accordingly, the first diode 114 may discharge a positive overdrive voltage to the common mode node 118 when the positive overdrive voltage exceeds a voltage of the common mode node 118 by the threshold voltage of the first diode 114. Therefore, the first diode 114 may protect the circuit from positive overdrive voltages.

The second diode 116 may have an anode of the second diode 116 coupled to the common mode node 118 and a cathode of the second diode 116 coupled to the input 102. The second diode 116 may conduct when a voltage at the input 102 is below a voltage of the common mode node 118 by at least a threshold voltage of the second diode 116. Accordingly, the second diode 116 may discharge a negative overdrive voltage to the common mode node 118 when the negative overdrive voltage is below a voltage of the common mode node 118 by the threshold voltage of the second diode 116. Therefore, the second diode 116 may protect the circuit from negative overdrive voltages.

The protection circuitry 100 may further include a termination resistor 120. The termination resistor 120 may be coupled between the input 102 and the common mode node 118. The termination resistor 120 may be coupled in parallel to the diode elements. A resistance of the termination resistor 120 may be greater than a resistance of each of the diode elements when either of the diode elements are conducting.

The input 102 may be coupled to buffer 104 and provide a signal to the buffer 104. The signal provided by the input 102 to the buffer may be approximately (with minor changes that may appear due to parasitic effects of the protection circuitry 100) a signal applied to the input 102 with any changes that may be affected by the circuitry of the electrostatic discharge protection (i.e., the first diode 106 and the second diode 108) and/or the overdrive protection (i.e., first diode 114 and the second diode 116). For example, the signal provided to the buffer 104 may be the signal at the input 102 minus any overdrive and/or electrostatic discharge that may be filtered out by the overdrive protection and/or the electrostatic discharge protection, respectively. An output of the buffer 104 may be provided to further circuitry of the system.

Figure 2:
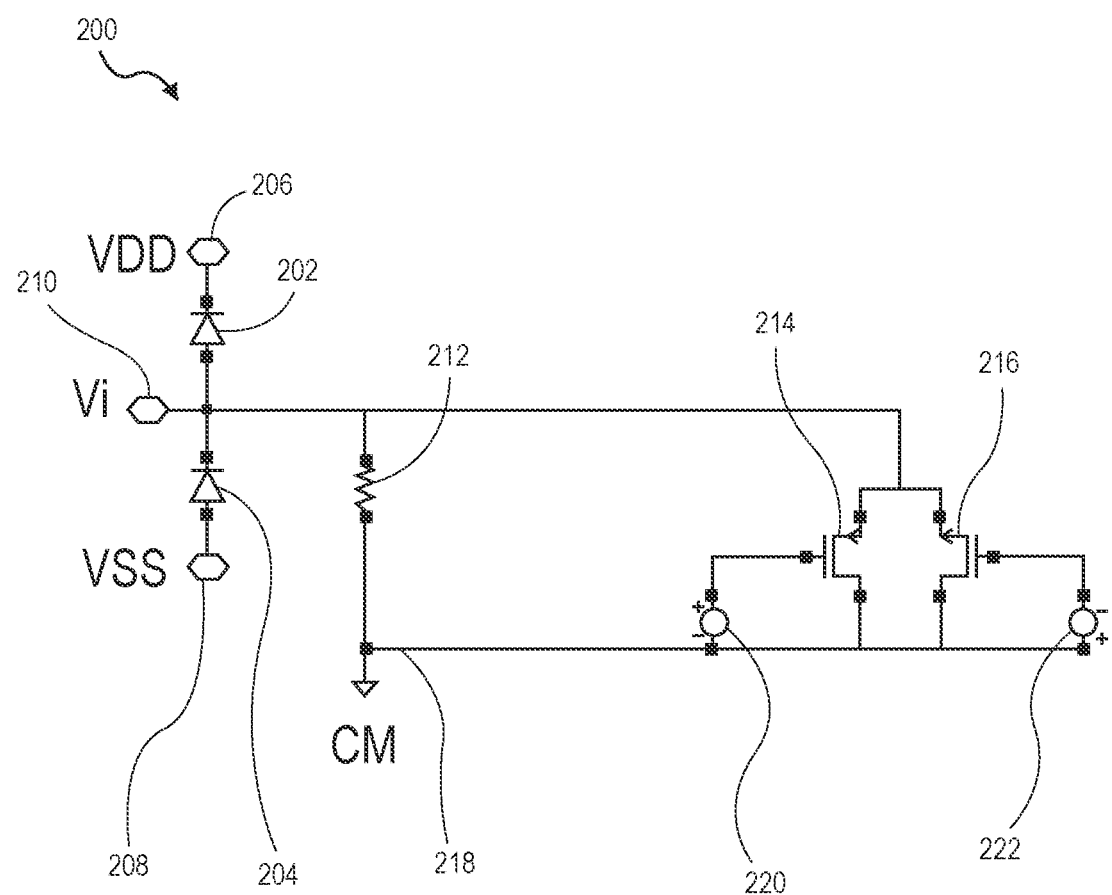
FIG. 2 illustrates another example protection circuitry, according to various embodiments of the disclosure.

FIG. 2 illustrates another example protection circuitry 200, according to various embodiments of the disclosure. The protection circuitry 200 may include one or more of the features of the protection circuitry 100 (FIG. 1). For example, the protection circuitry 200 may include electrostatic discharge protection having the features of the electrostatic discharge protection of FIG. 1. In particular, the electrostatic discharge protection of FIG. 2 may include a first diode 202 coupled between a positive voltage rail 206 and an input 210 of the circuit, and a second diode 204 coupled between a negative voltage rail 208 and the input 210 of the circuit, where the first diode 202 and the second diode 204 provide electrostatic discharge protection. Further, the protection circuitry 200 may include a termination resistor 212 that includes one or more of the features of the termination resistor 120 (FIG. 1).

The protection circuitry 200 may further include diode elements to provide overdrive protection for the circuit. Utilization of the diode elements may present lower parasitic loading, less lag time to engage, and less nonlinearity. Additionally, the utilization of the diode elements may provide for single-ended signal inputs and differential signal inputs. In the illustrated embodiment, the diode elements comprise a first transistor 214 and a second transistor 216. In the illustrated embodiment, the first transistor 214 and the second transistor 216 are illustrated as FETs. However, it should be understood that the first transistor 214 and the second transistor 216 may be other types of transistors in other embodiments, such as BJTs. The first transistor 214 and the second transistor 216 may be coupled between the input 210 and a common mode node 218 of the circuit, where the common mode node 218 may be set at a common node voltage of the circuit. In the illustrated embodiment, the common mode node 218 is shown set to a ground of the circuit, although it should be understood that the common mode node 218 may be set to other common node voltages in other embodiments.

The first transistor 214 may comprise a p-channel FET, such as a p-channel metal oxide semiconductor FET (pMOS). The first transistor 214 may have a source coupled to the input 210 and a drain coupled to the common mode node 218. A first threshold voltage may be applied to a gate of the first transistor 214. In the illustrated embodiment, a first power supply 220 may be coupled between the common mode node 218 and the gate of the first transistor 214, and the first power supply 220 may generate a bias voltage from a voltage of the common mode node 218 to produce the first threshold voltage. Applying the bias voltage to the gate of the first transistor 214, which can occur when power is supplied to the protection circuitry 200, may actively bias the first transistor 214. The bias voltage generated by the first power supply 220 may be a positive voltage, thereby causing the first threshold voltage to be greater than a voltage of the common mode node 218. In other embodiments, the first power supply 220 may be omitted and the first threshold voltage may be applied to the gate of the first transistor 214 by another source. The first transistor 214 may conduct current when a voltage at the input 210 (which is applied to the source of the first transistor 214) exceeds the first threshold voltage (which is applied to the gate of the first transistor 214). The first threshold voltage may be selected to be a maximum operational voltage for the circuit, where any overdrive voltage applied to the input 210 that exceeds the first threshold voltage may be discharged to the common mode node 218 by the first transistor 214. When the first transistor 214 is discharging the overdrive voltage, the voltage of the input 210 may be clamped at the first threshold voltage. When the voltage of the input 210 is below the first threshold voltage, the first transistor 214 may not conduct current and, therefore, not affect the signal at the input 210.

The second transistor 216 may comprise an n-channel FET, such as an n-channel metal oxide semiconductor FET (nMOS). The second transistor 216 may have a source coupled to the input 210 and a drain coupled to the common mode node 218. A second threshold voltage may be applied to a gate of the second transistor 216. In the illustrated embodiment, a second power supply 222 may be coupled between the common mode node 218 and the gate of the second transistor 216, and the second power supply 222 may generate a bias voltage from a voltage of the common mode node 218 to produce the second threshold voltage. Applying the bias voltage to the gate of the second transistor 216, which can occur when power is supplied to the protection circuitry 200, may actively bias the second transistor 216. The bias voltage generated by the second power supply 222 may be a negative voltage, thereby causing the second threshold voltage to be below a voltage of the common mode node 218. In other embodiments, the second power supply 222 may be omitted and the second threshold voltage may be applied to the gate of the second transistor 216 by another source. The second transistor 216 may conduct current when a voltage at the input 210 (which is applied to the source of the second transistor 216) exceeds the second threshold voltage (which is applied to the gate of the second transistor 216). The second threshold voltage may be selected to be a minimum operational voltage for the circuit, where any overdrive voltage applied to the input 210 that is below the second threshold voltage may be discharged to the common mode node 218 by the second transistor 216. When the second transistor 216 is discharging the overdrive voltage, the voltage of the input 210 may be clamped at the second threshold voltage. When the voltage of the input 210 is below the second threshold voltage, the second transistor 216 may not conduct current and, therefore, not affect the signal at the input 210.

In other embodiments, the first transistor 214 and the second transistor 216 may be replaced by diodes that are biased accordingly. For example, the first transistor 214 may be replaced by one or more diodes biased with the first threshold voltage. Further, the second transistor 216 may be replaced by one or more diodes biased with the second threshold voltage.

The input 210 may be coupled to an output (not shown for clarity) of the protection circuitry 200. For example, the input 210 may be coupled to a buffer (such as the buffer 104 (FIG. 1)), where the buffer may provide the output voltage to a rest of a circuit of the system. The input 210 may provide a signal to the output. The signal provided by the input 210 to the output may be approximately (with minor changes that may appear due to parasitic effects of the protection circuitry 200) a signal applied to the input 210 with any changes that may be affected by the circuitry of the electrostatic discharge protection (i.e., the first diode 202 and the second diode 204) and/or the overdrive protection (i.e., the first transistor 214 and the second transistor 216). For example, the signal provided to the output may be the signal at the input 210 minus any overdrive and/or electrostatic discharge that may be filtered out by the overdrive protection and/or the electrostatic discharge protection, respectively.

Figure 3:
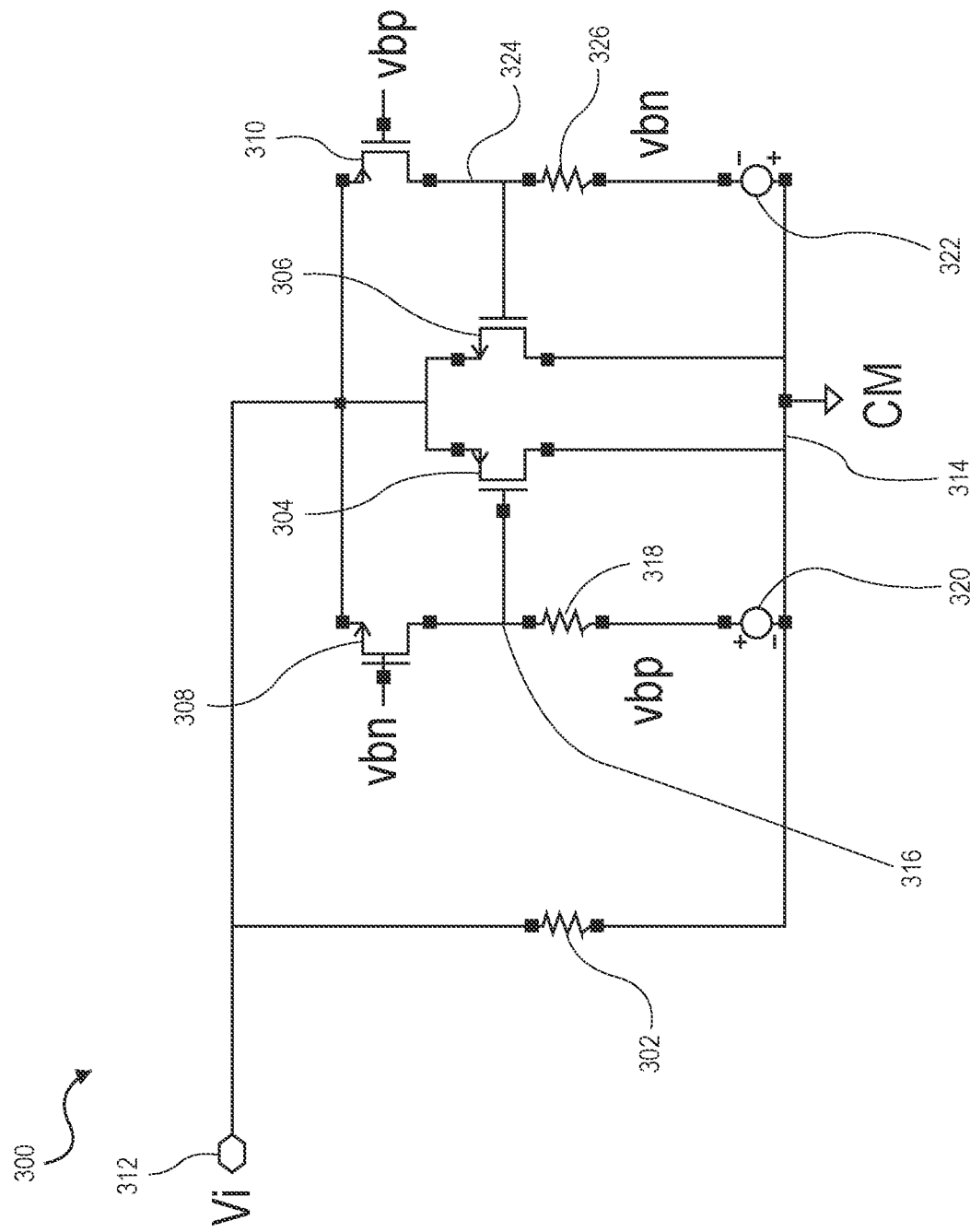
FIG. 3 illustrates another example protection circuitry, according to various embodiments of the disclosure.

FIG. 3 illustrates another example protection circuitry 300, according to various embodiments of the disclosure. The protection circuitry 300 may include one or more of the features of the protection circuitry 100 (FIG. 1) and/or the protection circuitry 200 (FIG. 2). For example, the protection circuitry 300 may include a termination resistor 302 that includes one or more of the features of the termination resistor 120 (FIG. 1) and/or the termination resistor 212 (FIG. 2). Further, while the protection circuitry 300 illustrated does not show electrostatic discharge protection, in other embodiments the protection circuitry 300 may include electrostatic discharge protection (such as the electrostatic discharge protection shown in FIG. 1 and/or the electrostatic discharge protection shown in FIG. 2).

The protection circuitry 300 may include diode elements to provide overdrive protection for a circuit. In the illustrated embodiment, the diode elements may include a first transistor 304, a second transistor 306, a third transistor 308, and a fourth transistor 310. In the illustrated embodiment, the first transistor 304, the second transistor 306, the third transistor 308, and the fourth transistor 310 are illustrated as FETs. However, it should be understood that the first transistor 304, the second transistor 306, the third transistor 308, and the fourth transistor 310 may be other types of transistors in other embodiments, such as BJTs. The transistors may be arranged in a feedback arrangement. For example, the third transistor 308 may provide feedback for the first transistor 304 and the fourth transistor 310 may provide feedback for the second transistor 306. The feedback arrangement of the diode elements of the protection circuitry 300 may provide twice the conductance of the diode elements of the protection circuitry 200 (FIG. 2) for the same sizes of transistors in each of the protection circuitry 300 and the protection circuitry 200.

The first transistor 304 may be coupled between an input 312 of the circuit and a common mode node 314 of the circuit, where the common mode node 314 may be set at a common node voltage of the circuit. In the illustrated embodiment, the common mode node 314 is shown set to a ground of the circuit, although it should be understood that the common mode node 314 may be set to other common node voltages in other embodiments. The first transistor 304 may comprise a p-channel FET, such as a PMOS. A source of the first transistor 304 may be coupled to the input 312 and a drain of the first transistor 304 may be coupled to the common mode node 314. The first transistor 304 may conduct current from the input 312 to the common mode node 314 when conducting current.

The third transistor 308 may be coupled between an input 312 and a first node 316. The first node 316 may be coupled to a gate of the first transistor 304 and a first resistor 318. A first threshold voltage vbp may be applied to the first resistor 318 at a side of the first resistor 318 opposite from the first node 316. In the illustrated embodiment, the first threshold voltage vbp may be generated by a first power supply 320 coupled to the common mode node 314. The first power supply 320 may generate the bias voltage referenced to the voltage of the common mode node 314 to produce the first threshold voltage vbp. The first threshold voltage vbp produced by the first power supply 320 may be a positive voltage. In other embodiments, the first power supply 320 may be omitted and the first threshold voltage vbp may be applied to the resistor by another source.

The third transistor 308 may comprise an n-channel FET, such as an NMOS. A source of the third transistor 308 may be coupled to the input 312 and a drain of the third transistor 308 may be coupled to the first node 316. A second threshold voltage vbn may be applied to a gate of the third transistor 308. In the illustrated embodiment, the second threshold voltage vbn may be generated by a second power supply 322 coupled to the common mode node 314. The second power supply 322 may generate the bias voltage referenced to the voltage of the common mode node 314 to produce the second threshold voltage vbn. Applying the bias voltage to the gate of the third transistor 308, which can occur when power is supplied to the protection circuitry 300, may actively bias the third transistor 308. The second threshold voltage vbn produced by the second power supply 322 may be a negative voltage. In other embodiments, the second power supply 322 may be omitted and the second threshold voltage vbn may be applied by another source.

The third transistor 308 may conduct current when a voltage at the source of the third transistor 308 is greater than a voltage at the drain of the third transistor 308. A voltage at the drain of the third transistor 308 may be equal to the first threshold voltage vbp when the third transistor 308 is not conducting current, and the third transistor 308 may conduct current when a voltage at the source of the third transistor 308 exceeds approximately the first threshold voltage vbp. The first transistor 304 may conduct current when a voltage applied at the source of the first transistor 304 exceeds a voltage at the gate of the first transistor 304. The third transistor 308 and the first transistor 304 may continue to conduct current until a voltage at the input 312 is below the first threshold voltage vbp. When the voltage applied at the input 312 exceeds the first threshold voltage vbp and the first transistor 304 and the third transistor 308 are conducting current, the first transistor 304 and the third transistor 308 may sink current to the common mode node 314 and/or the first power supply 320 to maintain the voltage at the input 312 at the first threshold voltage vbp.

The second transistor 306 may be coupled between the input 312 of the circuit and the common mode node 314 of the circuit, where the common mode node 314 may be set at a common node voltage of the circuit. The second transistor 306 may comprise an n-channel FET, such as an NMOS. A source of the second transistor 306 may be coupled to the input 312 and a drain of the second transistor 306 may be coupled to the common mode node 314. The second transistor 306 may conduct current from the input 312 to the common mode node 314 when conducting current.

The fourth transistor 310 may be coupled between the input 312 and a second node 324. The second node 324 may be coupled to a gate of the second transistor 306 and a second resistor 326. The second threshold voltage vbn may be applied to the second resistor 326 at a side of the second resistor 326 opposite from the second node 324. The fourth transistor 310 may comprise a p-channel FET, such as a PMOS. A source of the fourth transistor 310 may be coupled to the input 312 and a drain of the fourth transistor 310 may be coupled to the second node 324. The first threshold voltage vbn may be applied to a gate of the fourth transistor 310. The first power supply 320 may generate the bias voltage referenced to the voltage of the common mode node 314 to produce the first threshold voltage vbn. Applying the bias voltage to the gate of the fourth transistor 310, which can occur when power is supplied to the protection circuitry 300, may actively bias the fourth transistor 310. The first threshold voltage vbn produced by the first power supply 320 may be a positive voltage. In other embodiments, the first power supply 320 may be omitted and the first threshold voltage vbn may be applied by another source.

The fourth transistor 310 may conduct current when a voltage at the source of the fourth transistor 310 is below a voltage at the drain of the fourth transistor 310. A voltage at the drain of the fourth transistor 310 may be equal to the second threshold voltage vbp when the fourth transistor 310 is not conducting current, and the fourth transistor 310 may conduct current when a voltage at the source of the fourth transistor 310 is below the second threshold voltage vbp. The second transistor 306 may conduct current when a voltage at the source of the second transistor 306 exceeds a voltage at the gate of the second transistor 306. The fourth transistor 310 and the second transistor 306 may continue to conduct current until a voltage applied at the input 312 exceeds the second threshold voltage vbp. When the voltage applied at the input 312 is below the second threshold voltage vbp and the second transistor 306 and the fourth transistor 310 are conducting current, the second transistor 306 and the fourth transistor 310 may sink current to the input 312 to maintain the voltage at the input 312 at the second threshold voltage vbp.

The input 312 may be coupled to an output (not shown for clarity) of the protection circuitry 300. For example, the input 312 may be coupled to a buffer (such as the buffer 104 (FIG. 1)), where the buffer may provide the output voltage to a rest of a circuit of the system. The input 312 may provide a signal to the output. The signal provided by the input 312 to the output may be approximately (with minor changes that may appear due to parasitic effects of the protection circuitry 300) a signal applied to the input 312 with any changes that may be affected by the circuitry of the overdrive protection (i.e., the first transistor 304, the second transistor 306, the third transistor 308, and the fourth transistor 310) and/or any electrostatic discharge protection that may be implemented in the protection circuitry 300 in other embodiments. For example, the signal provided to the output may be the signal at the input 312 minus any overdrive and/or electrostatic discharge that may be filtered out by the overdrive protection and/or the electrostatic discharge protection, respectively.

The protection circuitry 300 may have greater conductance for overdrive protection than the protection circuitry 100 (FIG. 1) and the protection circuitry 200 (FIG. 2) when utilizing transistors of the same characteristics in each of the protection circuitries. For example, the protection circuitry 300 may have approximately (within 5%) twice the conductivity of the protection circuitry 100 and the protection circuitry 200 when utilizing transistors of the same characteristics in each of the protection circuitries due to two transistors conducting at once in the protection circuitry 300 to discharge the overdrive voltage.

Figure 4:
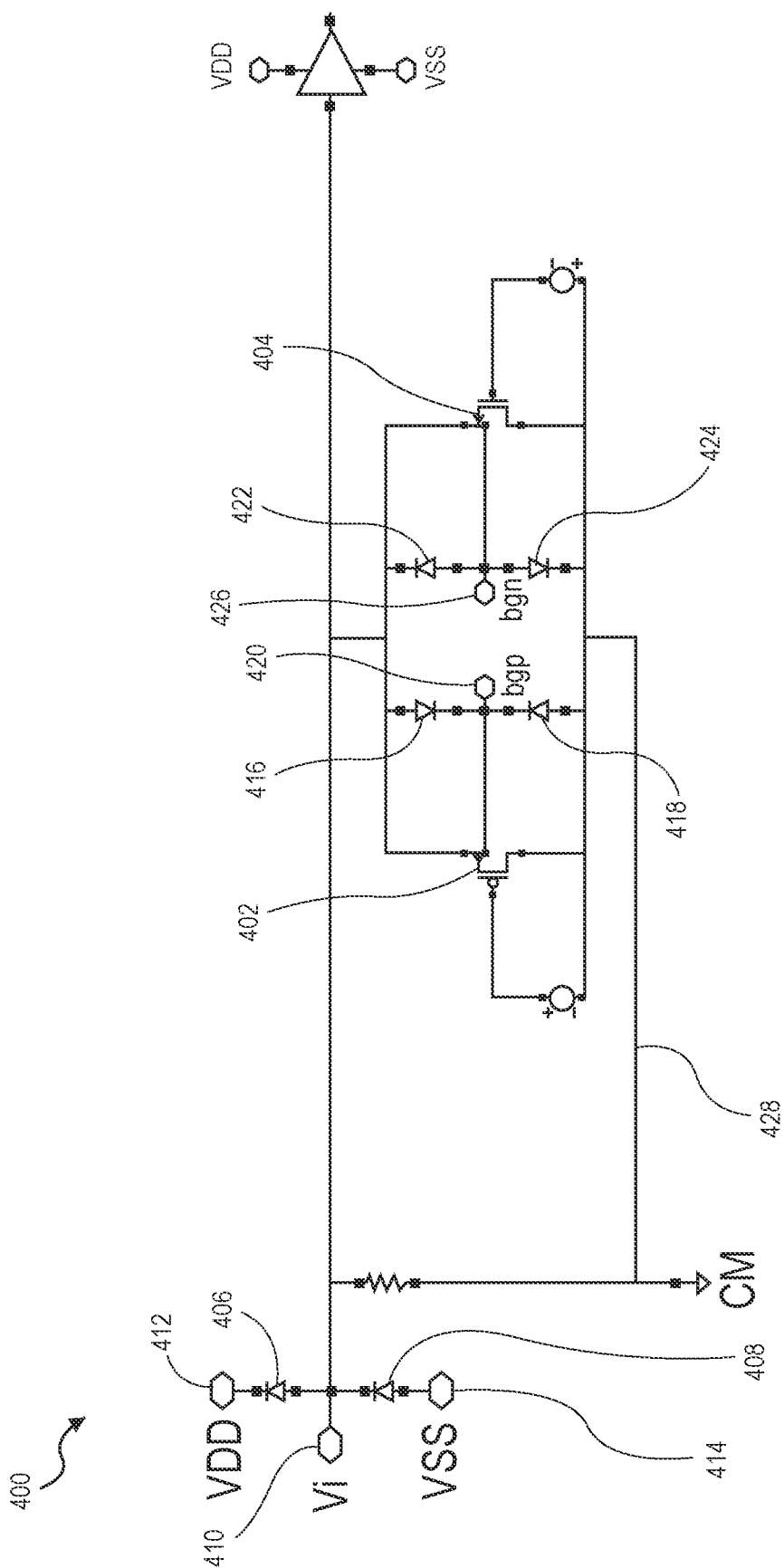
FIG. 4 illustrates another example protection circuitry, according to various embodiments of the disclosure.

FIG. 4 illustrates another example protection circuitry 400, according to various embodiments of the disclosure. The protection circuitry 400 may include one or more of the features of the protection circuitry 200 (FIG. 2). For example, the protection circuitry 400 may have the overdrive protection circuitry arrangement illustrated in the protection circuitry 200. In particular, the protection circuitry 400 may include a first transistor 402 having one or more of the features of the first transistor 214 (FIG. 2) and a second transistor 404 having one or more of the features of the second transistor 216 (FIG. 2). In the illustrated embodiment, the first transistor 402 and the second transistor 404 are illustrated as FETs. However, it should be understood that the first transistor 402 and the second transistor 404 may be other types of transistors in other embodiments, such as BJTs. The first transistor 402 and the second transistor 404 may have the same arrangement within the protection circuitry 400 as the first transistor 214 and the second transistor 216 have within the protection circuitry 200. Further, the protection circuitry 400 may have the electrostatic discharge circuitry arrangement illustrated in the protection circuitry. In particular, the protection circuitry 400 may include a first diode 406 coupled between an input 410 of the protection circuitry 400 and a positive voltage rail 412 of the protection circuitry 400, where the first diode 406 may sink positive electrostatic discharge experienced at the input 410 to the positive voltage rail 412. The protection circuitry 400 may further include a second diode 408 coupled between the input 410 and a negative voltage rail 414 of the protection circuitry 400, where the second diode 408 may sink negative electrostatic discharge experienced at the input 410 to the negative voltage rail 414.

The illustrated protection circuitry 400 shows diode features inherent within the first transistor 402 and the second transistor 404. In particular, a transistor may have a first diode feature formed between a source of the transistor and a back gate of the transistor, and a second diode feature formed between a drain of the transistor and the back gate of the transistor. The diode features may be referred to as back gate diodes. It should be understood that the diode features are not separate elements from the first transistor 402 and the second transistor 404, but are produced by the features of the first transistor 402 and the second transistor 404. The diode features may be formed by intersections of p-biased elements and n-biased elements within the transistor.

The first transistor 402 may include a first diode feature 416 and a second diode feature 418. The first diode feature 416 may be formed between a source of the first transistor 402 and a back gate of the first transistor 402. Due to the first transistor 402 being a p-channel FET, a forward bias direction of the first diode feature 416 may be in a direction from the source of the first transistor 402 to the back gate of the first transistor 402. In particular, an anode of the first diode feature 416 may be coupled to the source of the first transistor 402 and a cathode of the first diode feature 416 may be coupled to the back gate of the first transistor 402. The second diode feature 418 may be formed between a drain of the first transistor 402 and the back gate of the first transistor 402. Due to the first transistor 402 being a p-channel FET, a forward bias direction of the second diode feature 418 may be in a direction from drain of the first transistor 402 to the back gate of the first transistor 402. In particular, an anode of the second diode feature 418 may be coupled to the drain of the first transistor 402 and a cathode of the second diode feature 418 may be coupled to the back gate of the first transistor 402. In the illustrated embodiment, the back gate of the first transistor 402 is left floating, as shown by node 420 that is coupled to the back gate of the first transistor 402 being labeled bgp.

Based on the source of the first transistor 402 being coupled to the input 410, an anode of the first diode feature 416 may be coupled to the input 410. A cathode of the first diode feature 416 may be coupled to the floated node 420. Based on the drain of the first transistor 402 being coupled to a common mode node 428 of the protection circuitry 400, an anode of the second diode feature 418 may be coupled to the common mode node 428, where a common mode voltage may be applied to the common mode node 428. A cathode of the second diode feature 418 may be coupled to the floated node 420.

The second transistor 404 may include a first diode feature 422 and a second diode feature 424. The first diode feature 422 may be formed between a source of the second transistor 404 and a back gate of the second transistor 404. Due to the second transistor 404 being an n-channel FET, a forward bias direction of the first diode feature 422 may be in a direction from the back gate of the second transistor 404 to the source of the second transistor 404. In particular, an anode of the first diode feature 422 may be coupled to the back gate of the second transistor 404 and a cathode of the first diode feature 422 may be coupled to the gate of the second transistor 404. The second diode feature 424 may be formed between a drain of the second transistor 404 and the back gate of the second transistor 404. Due to the second transistor 404 being an n-channel FET, a forward bias direction of the second diode feature 424 may be in a direction from back gate of the second transistor 404 to the back gate of the second transistor 404. In particular, an anode of the second diode feature 424 may be coupled to the back gate of the second transistor 404 and a cathode of the second diode feature 424 may be coupled to the drain of the second transistor 404. In the illustrated embodiment, the back gate of the second transistor 404 is left floating, as shown by node 426 that is coupled to the back gate of the second transistor 404 being labeled bgn.

Based on the source of the second transistor 404 being coupled to the input 410, a cathode of the second diode feature 424 may be coupled to the input 410. An anode of the second diode feature 424 may be coupled to the floated node 426. Based on the drain of the second transistor 404 being coupled to the common mode node 428, a cathode of the second diode feature 424 may be coupled to the common mode node 428. An anode of the second diode feature 424 may be coupled to the floated node 426.

Figure 5:
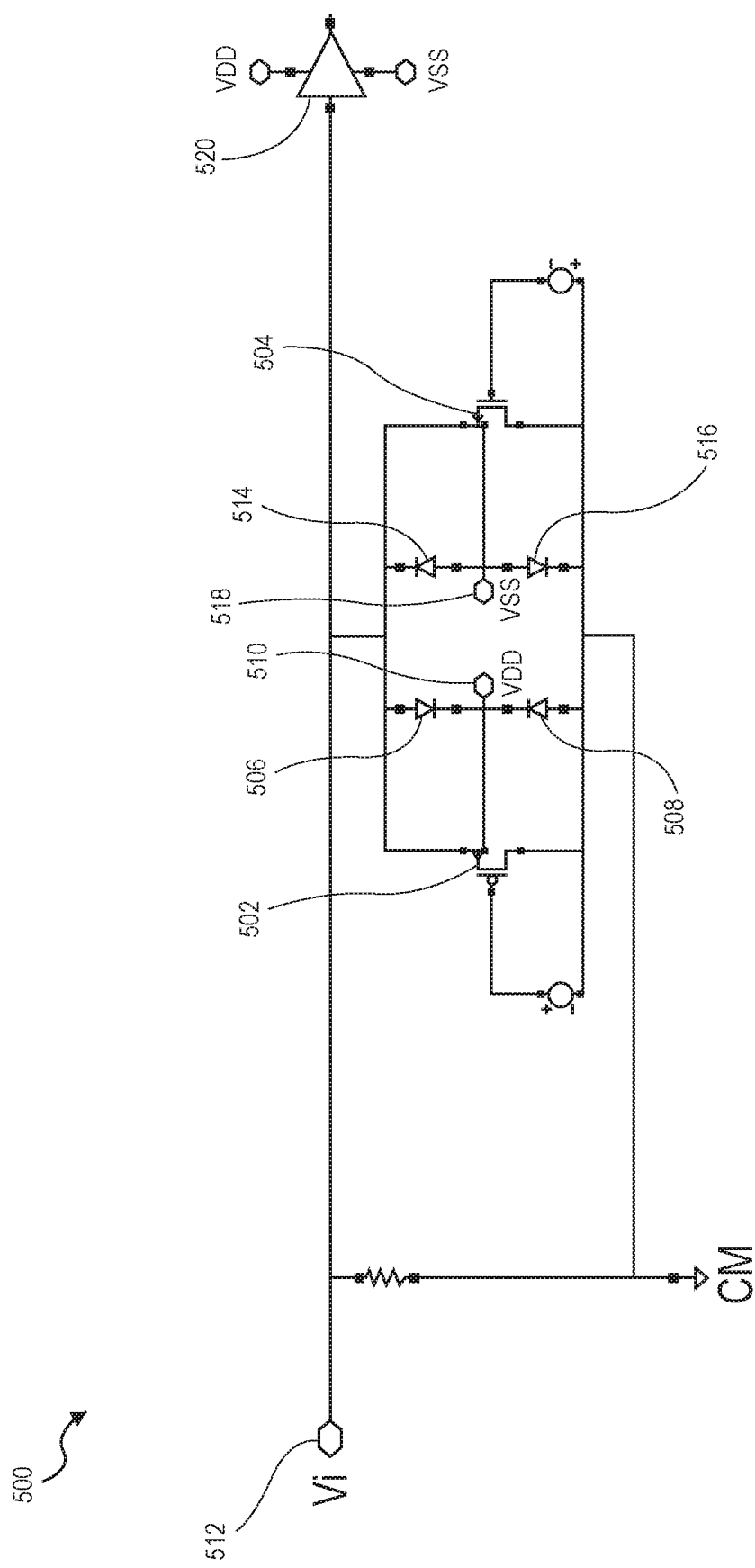
FIG. 5 illustrates another example protection circuitry, according to various embodiments of the disclosure.
Figure 6:
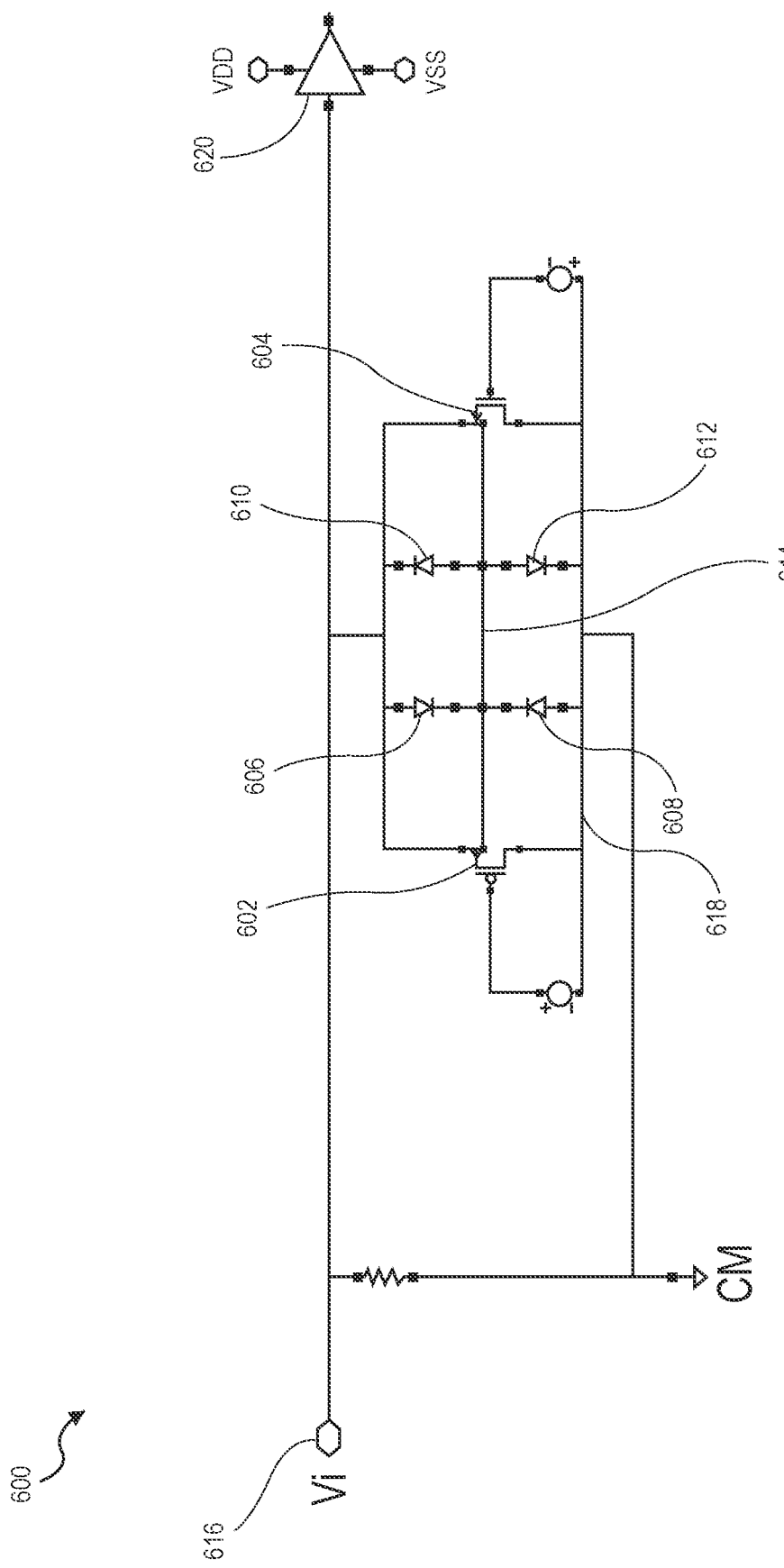
FIG. 6 illustrates another example protection circuitry, according to various embodiments of the disclosure.

In some embodiments, the diode features of the first transistor 402 and the second transistor 404 may be utilized for electrostatic discharge protection in place of the first diode 406 and the second diode 408, as described further in relation to FIG. 5 and FIG. 6. In particular, the first diode feature 416 and the second diode feature 418 of the first transistor 402 and the first diode feature 422 and the second diode feature 424 of the second transistor 404 may be utilized for electrostatic discharge protection and the first diode 406 and the second diode 408 may be omitted. Utilizing the diode features of the first transistor 402 and the second transistor 404 with the first diode 406 and the second diode 408 omitted may significantly reduce the capacitance at the input 410, which may reduce a voltage level variable capacitance of the protection circuitry 400.

While the illustrated protection circuitry 400 has the overdrive protection arrangement of the protection circuitry 200, it should be understood that the diode features may be included in the transistors of the protection circuitry 300 (FIG. 3) and that the diode features of the protection circuitry 300 may be utilized for electrostatic discharge protection as described in relation to the protection circuitry 400. For example, the first transistor 304 (FIG. 3) and the second transistor 306 (FIG. 3) may have diode features corresponding to the diode features of the first transistor 402 and the second transistor 404, respectively. Further, the diode features of the first transistor 304 and the second transistor 306 may have the same connections as the diode features of the first transistor 402 and the second transistor 404, respectively, with respect to the input 312, the common mode node 314, and the back gate of the transistors of the protection circuitry 300. The diode features of the protection circuitry 300 may provide electrostatic discharge protection as described in relation to the protection circuitry 400.

FIG. 5 illustrates another example protection circuitry 500, according to various embodiments of the disclosure. The protection circuitry 500 may include one or more of the features of the protection circuitry 400 (FIG. 4). For example, the protection circuitry 500 may have the overdrive protection circuitry arrangement illustrated in the protection circuitry 400. In particular, the protection circuitry 500 may include a first transistor 502 having one or more of the features of the first transistor 402 (FIG. 4) and a second transistor 504 having one or more of the features of the second transistor 404 (FIG. 4). In the illustrated embodiment, the first transistor 502 and the second transistor 504 are illustrated as FETs. However, it should be understood that the first transistor 502 and the second transistor 504 may be other types of transistors in other embodiments, such as BJTs. The first transistor 502 and the second transistor 504 may have the same arrangement within the protection circuitry 500 as the first transistor 402 and the second transistor 404 have within the protection circuitry 400.

The first transistor 502 may include a first diode feature 506 and a second diode feature 508. The first diode feature 506 may be formed between a source of the first transistor 502 and a back gate of the first transistor 502. Due to the first transistor 502 being a p-channel FET, a forward bias direction of the first diode feature 506 may be in a direction from the source of the first transistor 502 to the back gate of the first transistor 502. In particular, an anode of the first diode feature 506 may be coupled to the source of the first transistor 502 and a cathode of the first diode feature 506 may be coupled to the back gate of the first transistor 502. The second diode feature 508 may be formed between a drain of the first transistor 502 and the back gate of the first transistor 502. Due to the first transistor 502 being a p-channel FET, a forward bias direction of the second diode feature 508 may be in a direction from drain of the first transistor 502 to the back gate of the first transistor 502. In particular, an anode of the second diode feature 508 may be coupled to the drain of the first transistor 502 and a cathode of the second diode feature 508 may be coupled to the back gate of the first transistor 502.

In the illustrated embodiment, the back gate of the first transistor 502 is tied to positive voltage rail 510 of the protection circuitry 500. Accordingly, a cathode of the first diode feature 506 is coupled to the positive voltage rail 510. Further, the source of the first transistor 502 is coupled to an input 512 of the protection circuitry 500. Accordingly, an anode of the first diode feature 506 is coupled to the input 512. When a voltage applied to the input 512 exceeds a voltage of the positive voltage rail 510 by a forward voltage of the first diode feature 506, the first diode feature 506 may conduct current and may sink current to the positive voltage rail 510. The voltage applied to the input 512 may exceed the voltage of the positive voltage rail 510 plus the forward voltage of the first diode feature 506 when a positive electrostatic discharge is applied to the input 512. The sinking of the current to the positive voltage rail 510 when the voltage applied to the input 512 exceeds the voltage of the positive voltage rail 510 plus the forward voltage of the first diode feature 506 may operate to maintain a voltage at the input 512 to be equal to the voltage of positive voltage rail 510 plus the voltage of the forward voltage of the first diode feature 506. Accordingly, the first diode feature 506 may discharge any electrostatic discharge applied to the input 512 that exceeds the voltage of the positive voltage rail 510 plus the forward voltage of the first diode feature 506, thereby operating as protection from positive voltage electrostatic discharges.

The second transistor 504 may include a first diode feature 514 and a second diode feature 516. The first diode feature 514 may be formed between a source of the second transistor 504 and a back gate of the second transistor 504. Due to the second transistor 504 being an n-channel FET, a forward bias direction of the first diode feature 514 may be in a direction from the back gate of the second transistor 504 to the source of the second transistor 504. In particular, an anode of the first diode feature 514 may be coupled to the back gate of the second transistor 504 and a cathode of the first diode feature 514 may be coupled to the source of the second transistor 504. The second diode feature 516 may be formed between a drain of the second transistor 504 and the back gate of the second transistor 504. Due to the second transistor 504 being an n-channel FET, a forward bias direction of the second diode feature 516 may be in a direction from back gate of the second transistor 504 to the drain of the second transistor 504. In particular, an anode of the second diode feature 516 may be coupled to the back gate of the second transistor 504 and a cathode of the second diode feature 516 may be coupled to the drain of the second transistor 504.

In the illustrated embodiment, the back gate of the second transistor 504 is tied to negative voltage rail 518 of the protection circuitry 500. Accordingly, an anode of the first diode feature 514 is coupled to the negative voltage rail 518. Further, the source of the second transistor 504 is coupled to the input 512. Accordingly, a cathode of the first diode feature 514 is coupled to the input 512. When a voltage applied to the input 512 is below a voltage of the negative voltage rail 518 minus a forward voltage of the first diode feature 514, the first diode feature 514 may conduct current and may source current from the negative voltage rail 518. The sourcing of the current from the negative voltage rail 518 when the voltage applied to the input 512 is below the voltage of the negative voltage rail 518 minus the forward voltage of the first diode feature 514 may operate to maintain a voltage at the input 512 to be equal to the voltage of negative voltage rail 518 minus the forward voltage of the first diode feature 514. Accordingly, the first diode feature 514 may discharge any electrostatic discharge applied to the input 512 that is below the voltage of the negative voltage rail 518 plus the voltage of the forward voltage of the first diode feature 514, thereby operating as protection from negative voltage electrostatic discharges.

An output of the protection circuitry 500 may be coupled to the input 512. In the illustrated embodiment, a buffer 520 is located at an output of the protection circuitry 500. The electrostatic discharge protection provided by the diode features of the first transistor 502 and the second transistor 504 may prevent the buffer 520 from experience voltages outside of the voltage range defined by the voltage rails and the forward voltages of the diode features. In particular, the diode features may maintain a voltage applied to an input of the buffer 520 between a voltage of the positive voltage rail 510 plus the forward voltage of the first diode feature 506 and a voltage of the negative voltage rail minus the forward voltage of the first diode feature 514 when electrostatic discharge is applied to the input 512. Accordingly, the output of the buffer 520 may be maintained within a voltage range defined by the voltage rails and the diode features, thereby protecting a circuit coupled to the buffer 520 from voltages outside of the range, which may cause damage to the circuit.

In the illustrated embodiment, diodes explicitly utilized for electrostatic discharge protection may be omitted from the protection circuitry 500. In particular, the diode features of the first transistor 502 and the second transistor 504 may provide electrostatic discharge protection in place of the diodes explicitly utilized for electrostatic discharge protection of legacy protection circuitry. Utilizing the diode features of the first transistor 502 and second transistor 504, and omitting the diodes explicitly utilized for electrostatic discharge protection of legacy protection circuitry can result in lower capacitance at the input 512 of the protection circuitry 500 than in the legacy protection circuitry. The lower capacitance may result in less nonlinearity based on voltage level variable capacitance being less for the protection circuitry 500. Further, the utilization of the diode features of the first transistor 502 and the second transistor 504 may result in less parasitic loading of the protection circuitry 500 than legacy protection circuitry.

While the illustrated protection circuitry 500 has the overdrive protection arrangement of the protection circuitry 200 (FIG. 2), it should be understood that the diode features may be included in the transistors of the protection circuitry 300 (FIG. 3) and that the diode features of the protection circuitry 300 may be utilized for electrostatic discharge protection as described in relation to the protection circuitry 500. For example, the first transistor 304 (FIG. 3) and the second transistor 306 (FIG. 3) may have diode features corresponding to the diode features of the first transistor 502 and the second transistor 504, respectively. Further, the diode features of the first transistor 304 and the second transistor 306 may have the same connections as the diode features of the first transistor 502 and the second transistor 504, respectively, with respect to the input 312, the common mode node 314, and the back gate of the transistors of the protection circuitry 300. The diode features of the protection circuitry 300 may provide electrostatic discharge protection as described in relation to the protection circuitry 500.

FIG. 6 illustrates another example protection circuitry 600, according to various embodiments of the disclosure. The protection circuitry 600 may include one or more of the features of the protection circuitry 400 (FIG. 4). For example, the protection circuitry 600 may have the overdrive protection circuitry arrangement illustrated in the protection circuitry 400. In particular, the protection circuitry 600 may include a first transistor 602 having one or more of the features of the first transistor 402 (FIG. 4) and a second transistor 604 having one or more of the features of the second transistor 404 (FIG. 4). In the illustrated embodiment, the first transistor 602 and the second transistor 604 are illustrated as FETs. However, it should be understood that the first transistor 602 and the second transistor 604 may be other types of transistors in other embodiments, such as BJTs. The first transistor 602 and the second transistor 604 may have the same arrangement within the protection circuitry 600 as the first transistor 402 and the second transistor 404 have within the protection circuitry 400.

The first transistor 602 may include a first diode feature 606 and a second diode feature 608. The first diode feature 606 may be formed between a source of the first transistor 602 and a back gate of the first transistor 602. Due to the first transistor 602 being a p-channel FET, a forward bias direction of the first diode feature 606 may be in a direction from the source of the first transistor 602 to the back gate of the first transistor 602. In particular, an anode of the first diode feature 606 may be coupled to the source of the first transistor 602 and a cathode of the first diode feature 606 may be coupled to the back gate of the first transistor 602. The second diode feature 608 may be formed between a drain of the first transistor 602 and the back gate of the first transistor 602. Due to the first transistor 602 being a p-channel FET, a forward bias direction of the second diode feature 608 may be in a direction from drain of the first transistor 602 to the back gate of the first transistor 602. In particular, an anode of the second diode feature 608 may be coupled to the drain of the first transistor 602 and a cathode of the second diode feature 608 may be coupled to the back gate of the first transistor 602.

The second transistor 604 may include a first diode feature 610 and a second diode feature 612. The first diode feature 610 may be formed between a source of the second transistor 604 and a back gate of the second transistor 604. Due to the second transistor 604 being an n-channel FET, a forward bias direction of the first diode feature 610 may be in a direction from the back gate of the second transistor 604 to the source of the second transistor 604. In particular, an anode of the first diode feature 610 may be coupled to the back gate of the second transistor 604 and a cathode of the first diode feature 610 may be coupled to the source of the second transistor 604. The second diode feature 612 may be formed between a drain of the second transistor 604 and the back gate of the second transistor 604. Due to the second transistor 604 being an n-channel FET, a forward bias direction of the second diode feature 612 may be in a direction from back gate of the second transistor 604 to the drain of the second transistor 604. In particular, an anode of the second diode feature 612 may be coupled to the back gate of the second transistor 604 and a cathode of the second diode feature 612 may be coupled to the drain of the second transistor 604.

The back of the first transistor 602 may be coupled to the back gate of the second transistor 604. Accordingly, the first diode feature 606, the second diode feature 608, the first diode feature 610, and the second diode feature 612 may be coupled together. In particular, a cathode of the first diode feature 606, a cathode of the second diode feature 608, an anode of the first diode feature 610, and an anode of the second diode feature 612 may be coupled together at a node 614.

A source of the first transistor 602 may be coupled to an input 616 of the protection circuitry 600. The source of the first transistor 602 being coupled to the input 616 may cause an anode of the first diode feature 606 of the first transistor 602 to be coupled to the input 616, and the first diode feature 606 may conduct when a voltage applied to the input 616 exceeds a voltage of the node 614 plus a forward voltage of the first diode feature 606. A drain of the second transistor 604 may be coupled to a common mode node 618, where a common mode voltage of the protection circuitry 600 may be applied to the common mode node 618. The drain of the second transistor 604 being coupled to the common mode node 618 may cause a cathode of the second diode feature 612 of the second transistor 604 to be coupled to the common mode node 618, and the second diode feature 612 may conduct current when a voltage of the node 614 exceeds a voltage of the common mode node 618 plus a forward voltage of the second diode feature 612.

The cathode of the first diode feature 606 of the first transistor 602 being coupled to the node 614 and an anode of the second diode feature 612 of the second transistor 604 being coupled to the node 614 may cause the first diode feature 606 and the second diode feature 612 to be coupled in series between the input 616 and the common mode node 618. Having the first diode feature 606 and the second diode feature 612 in series presents a current path from the input 616 to the common mode node 618 when a voltage applied to the input 616 exceeds a voltage of the common mode node 618 plus a forward voltage of the first diode feature 606 and a forward voltage of the second diode feature 612. Accordingly, when a voltage applied to the input 616 exceeds a voltage of the common mode node 618 plus the forward voltage of the first diode feature 606 and the forward voltage of the second diode feature 612 (as may occur when a positive electrostatic discharge is applied to the input 616), the first diode feature 606 and the second diode feature 612 may couple the input 616 to the common mode node 618 and current may sink from the input 616 to the common mode node 618. While the voltage applied to the input 616 exceeds the voltage of the common mode node 618 plus the forward voltage of the first diode feature 606 and the forward voltage of the second diode feature 612, a voltage of the input 616 may be maintained at the voltage of the common mode node 618 plus the forward voltage of the first diode feature 606 and the second diode feature 612 due to the current being sinked to the common mode node 618. Accordingly, the protection circuitry 600 may prevent electrostatic discharge from causing a voltage at the input 616 from exceeding a voltage of the common mode node 618 plus the forward voltage of the first diode feature 606 and the forward voltage of the second diode feature 612.

A source of the second transistor 604 may be coupled to the input 616. The source of the second transistor 604 being coupled to the input 616 may cause a cathode of the first diode feature 610 of the second transistor 604 to be coupled to the input 616, and the first diode feature 610 may conduct when a voltage applied to the input 616 is below a voltage of the node 614 minus a forward voltage of the first diode feature 610. A drain of the first transistor 602 may be coupled to the common mode node 618. The drain of the second transistor 604 being coupled to the common mode node 618 may cause an anode of the second diode feature 608 of the first transistor 602 to be coupled to the common mode node 618, and the second diode feature 608 may conduct current when a voltage of the node 614 is below a voltage of the common mode node 618 minus a forward voltage of the second diode feature 608.

The anode of the first diode feature 610 of the second transistor 604 being coupled to the node 614 and a cathode of the second diode feature 608 of the first transistor 602 being coupled to the node 614 may cause the first diode feature 610 and the second diode feature 608 to be coupled in series between the input 616 and the common mode node 618. Having the first diode feature 610 and the second diode feature 608 in series presents a current path from the input 616 to the common mode node 618 when a voltage applied to the input 616 is below a voltage of the common mode node 618 minus a forward voltage of the first diode feature 610 and a forward voltage of the second diode feature 608. Accordingly, when a voltage applied to the input 616 is below a voltage of the common mode node 618 minus the forward voltage of the first diode feature 610 and the forward voltage of the second diode feature 608 (as may occur when a negative electrostatic discharge is applied to the input 616), the first diode feature 610 and the second diode feature 608 may couple the input 616 to the common mode node 618 and current may source from the common mode node 618 to the input 616. While the voltage applied to the input 616 is below the voltage of the common mode node 618 minus the forward voltage of the first diode feature 610 and the forward voltage of the second diode feature 608, a voltage of the input 616 may be maintained at the voltage of the common mode node 618 minus the forward voltage of the first diode feature 610 and the second diode feature 608 due to the current being sourced from the common mode node 618. Accordingly, the protection circuitry 600 may prevent electrostatic discharge from causing a voltage at the input 616 from being below a voltage of the common mode node 618 minus the forward voltage of the first diode feature 610 and the forward voltage of the second diode feature 608.

An output of the protection circuitry 600 may be coupled to the input 616. In the illustrated embodiment, a buffer 620 is located at an output of the protection circuitry 600. The electrostatic discharge protection provided by the diode features of the first transistor 602 and the second transistor 604 may prevent the buffer 620 from experience voltages outside of the voltage range defined by the common mode voltage of the common mode node 618 and the forward voltages of the diode features. In particular, the diode features may maintain a voltage applied to an input of the buffer 620 between the common mode voltage plus the forward voltage of the first diode feature 606 and the second diode feature 612 and the common mode voltage minus the forward voltage of the first diode feature 610 and the second diode feature 608 when electrostatic discharge is applied to the input 616. Accordingly, the output of the buffer 620 may be maintained within a voltage range defined by the common mode voltage and the diode features, thereby protecting a circuit coupled to the buffer 620 from voltages outside of the range, which may cause damage to the circuit.

In the illustrated embodiment, diodes explicitly utilized for electrostatic discharge protection may be omitted from the protection circuitry 600. In particular, the diode features of the first transistor 602 and the second transistor 604 may provide electrostatic discharge protection in place of the diodes explicitly utilized for electrostatic discharge protection of legacy protection circuitry. Utilizing the diode features of the first transistor 602 and second transistor 604, and omitting the diodes explicitly utilized for electrostatic discharge protection of legacy protection circuitry can result in lower capacitance at the input 616 of the protection circuitry 600 than in the legacy protection circuitry. The lower capacitance may result in less nonlinearity based on voltage level variable capacitance being less for the protection circuitry 600. Further, the utilization of the diode features of the first transistor 602 and the second transistor 604 may result in less parasitic loading of the protection circuitry 600 than legacy protection circuitry.

While the illustrated protection circuitry 600 has the overdrive protection arrangement of the protection circuitry 200 (FIG. 2), it should be understood that the diode features may be included in the transistors of the protection circuitry 300 (FIG. 3) and that the diode features of the protection circuitry 300 may be utilized for electrostatic discharge protection as described in relation to the protection circuitry 600. For example, the first transistor 304 (FIG. 3) and the second transistor 306 (FIG. 3) may have diode features corresponding to the diode features of the first transistor 602 and the second transistor 604, respectively. Further, the diode features of the first transistor 304 and the second transistor 306 may have the same connections as the diode features of the first transistor 602 and the second transistor 604, respectively, with respect to the input 312, the common mode node 314, and the back gate of the transistors of the protection circuitry 300. The diode features of the protection circuitry 300 may provide electrostatic discharge protection as described in relation to the protection circuitry 600.

Figure 7:
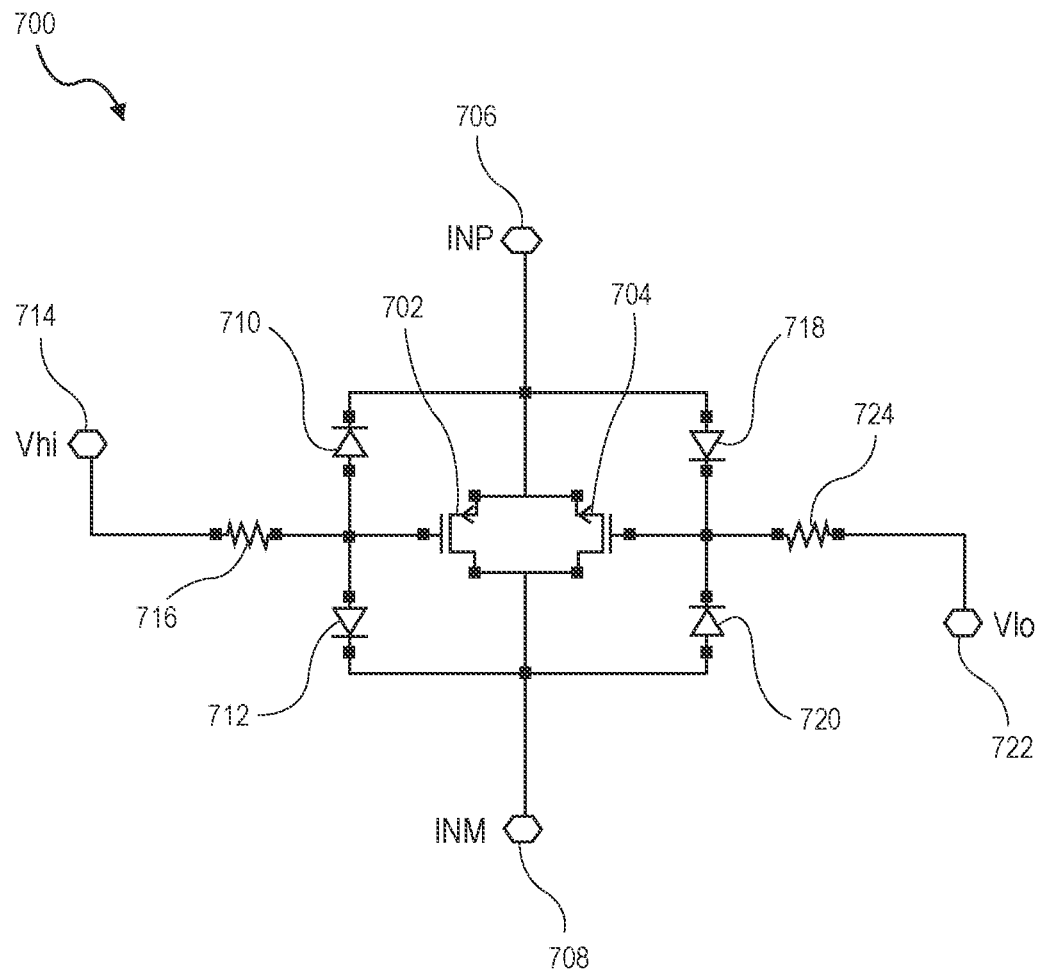
FIG. 7 illustrates an example field effect transistor arrangement, according to various embodiments of the disclosure.

FIG. 7 illustrates another example protection circuitry 700, according to various embodiments of the disclosure. The protection circuitry 700 may include one or more of the features of the protection circuitry 400 (FIG. 4). For example, the protection circuitry 700 may include a first transistor 702 having one or more of the features of the first transistor 402 (FIG. 4) and a second transistor 704 having one or more of the features of the second transistor 404 (FIG. 4). In the illustrated embodiment, the first transistor 702 and the second transistor 704 are illustrated as FETs. However, it should be understood that the first transistor 702 and the second transistor 704 may be other types of transistors in other embodiments, such as BJTs.

The protection circuitry 700 may act as a clamp circuitry for a differential circuit. For example, a positive input 706 of the protection circuitry 700 may be coupled to a positive component of a differential signal of the differential circuit. A negative input 708 of the protection circuitry 700 may be coupled to a negative component of the differential signal of the differential circuit. The protection circuitry 700 may provide overdrive protection for the differential circuit. For example, the protection circuitry 700 may maintain a voltage difference between a positive component and a negative component of the differential signal within a certain range, where the range may be defined by a threshold voltage of one or more of the transistors within the protection circuitry 700.

The first transistor 702 may comprise a p-channel FET. A source of the first transistor 702 may be coupled to the positive input 706 of the protection circuitry 700. A drain of the first transistor 702 may be coupled to the negative input 708 of the protection circuitry 700.

The second transistor 704 may comprise an n-channel FET. A source of the second transistor 704 may be coupled to the positive input 706 of the protection circuitry 700. A drain of the second transistor 704 may be coupled to the negative input 708 of the protection circuitry 700.

The protection circuitry 700 may further include a first diode 710. The first diode 710 may be coupled between a gate of the first transistor 702 and the source of the first transistor 702. In particular, an anode of the first diode 710 may be coupled to the gate of the first transistor 702 and a cathode of the first diode 710 may be coupled to the source of the first transistor 702.

The protection circuitry 700 may further include a second diode 712. The second diode 712 may be coupled between the gate of the first transistor 702 and the drain of the first transistor 702. In particular, an anode of the second diode 712 may be coupled to the gate of the first transistor 702 and a cathode of the second diode 712 may be coupled to the drain of the first transistor 702.

A gate of the first transistor 702 may be coupled to a first threshold voltage 714 via a resistor 716. For example, the gate of first transistor 702 may be coupled to a power supply that produces the first threshold voltage 714 in some embodiments. The first threshold voltage 714 may be a positive voltage, which may be a maximum voltage for operation of the circuit for which the protection circuitry 700 is providing overdrive protection. In some embodiments, the first threshold voltage 714 may be set to voltage that is a threshold voltage of the first transistor 702 below the maximum voltage for operation of the circuit for which the protection circuitry 700 is providing overdrive protection. The first transistor 702 may conduct current when a voltage applied to the positive input 706 exceeds a voltage at the gate of the first transistor 702 by a threshold voltage of the first transistor 702. A voltage at the gate of the first transistor 702 may be defined by a voltage applied to the positive input 706, a voltage applied to the negative input 708, or a first threshold voltage 714. In particular, the first diode 710 and the second diode 712 may cause a voltage at the gate of the first transistor 702 to be equal to the lower voltage of either the voltage applied to the positive input 706 or the voltage applied to the negative input 708 minus the threshold voltage of the corresponding first diode 710 or the second diode 712 when the voltage applied to the positive input 706 and/or the voltage applied to the negative input 708 are below the first threshold voltage 714. When both the voltage applied to the positive input 706 and the voltage applied to the negative input 708 exceed the first threshold voltage 714, the voltage at the gate may be set to the first threshold voltage 714. Based on when the first transistor 702 conducts and voltage at the gate of the first transistor 702, the first transistor 702 may conduct when a voltage applied to the positive input 706 exceeds a voltage applied to the negative input 708 by the threshold voltage of the first transistor 702, thereby coupling the positive input 706 to the negative input 708. Thereby, the protection circuitry 700 may maintain a voltage at the positive input 706 to within the threshold voltage of the first transistor 702 above a voltage at the negative input 708. Accordingly, the protection circuitry 700 may protect against overdrive of the positive differential input over the negative differential input.

The protection circuitry 700 may further include a third diode 718. The third diode 718 may be coupled between a gate of the second transistor 704 and the source of the second transistor 704. In particular, an anode of the third diode 718 may be coupled to the source of the second transistor 704 and a cathode of the third diode 718 may be coupled to the gate of the second transistor 704.

The protection circuitry 700 may further include a fourth diode 720. The fourth diode 720 may be coupled between the gate of the second transistor 704 and the drain of the second transistor 704. In particular, an anode of the fourth diode 720 may be coupled to the drain of the second transistor 704 and a cathode of the fourth diode 720 may be coupled to the gate of the second transistor 704.

A gate of the second transistor 704 may be coupled to a second threshold voltage 722 via a resistor 724. For example, the gate of second transistor 704 may be coupled to a power supply that produces the second threshold voltage 722 in some embodiments. The second threshold voltage 722 may be a negative voltage, which may be a minimum voltage for operation of the circuit for which the protection circuitry 700 is providing overdrive protection. In some embodiments, the second threshold voltage 722 may be set to voltage that is a threshold voltage of the second transistor 704 above the minimum voltage for operation of the circuit for which the protection circuitry 700 is providing overdrive protection. The second transistor 704 may conduct current when a voltage at the gate of the second transistor 704 exceeds a voltage applied to the positive input 706 by a threshold voltage of the second transistor 704. A voltage at the gate of the first transistor 702 may be defined by a voltage applied to the positive input 706, a voltage applied to the negative input 708, or the second threshold voltage 722. In particular, the third diode 718 and the fourth diode 720 may cause a voltage at the gate of the second transistor 704 to be equal to the higher voltage of either the voltage applied to the positive input 706 or the voltage applied to the negative input 708 minus the threshold voltage of the corresponding third diode 718 or the fourth diode 720 when the voltage applied to the positive input 706 and/or the voltage applied to the negative input 708 are greater than the second threshold voltage 722. When both the voltage applied to the positive input 706 and the voltage applied to the negative input 708 are below the second threshold voltage 722, the voltage at the gate may be set to the second threshold voltage 722. Based on when the second transistor 704 conducts and voltage at the gate of the second transistor 704, the second transistor 704 may conduct when a voltage applied to the positive input 706 is below a voltage applied to the negative input 708 by the threshold voltage of the second transistor 704, thereby coupling the positive input 706 to the negative input 708. Thereby, the protection circuitry 700 may maintain a voltage at the positive input 706 to within the threshold voltage of the first transistor 702 below a voltage at the negative input 708. Accordingly, the protection circuitry 700 may protect against overdrive of the positive differential input below the negative differential input.

Figure 8:
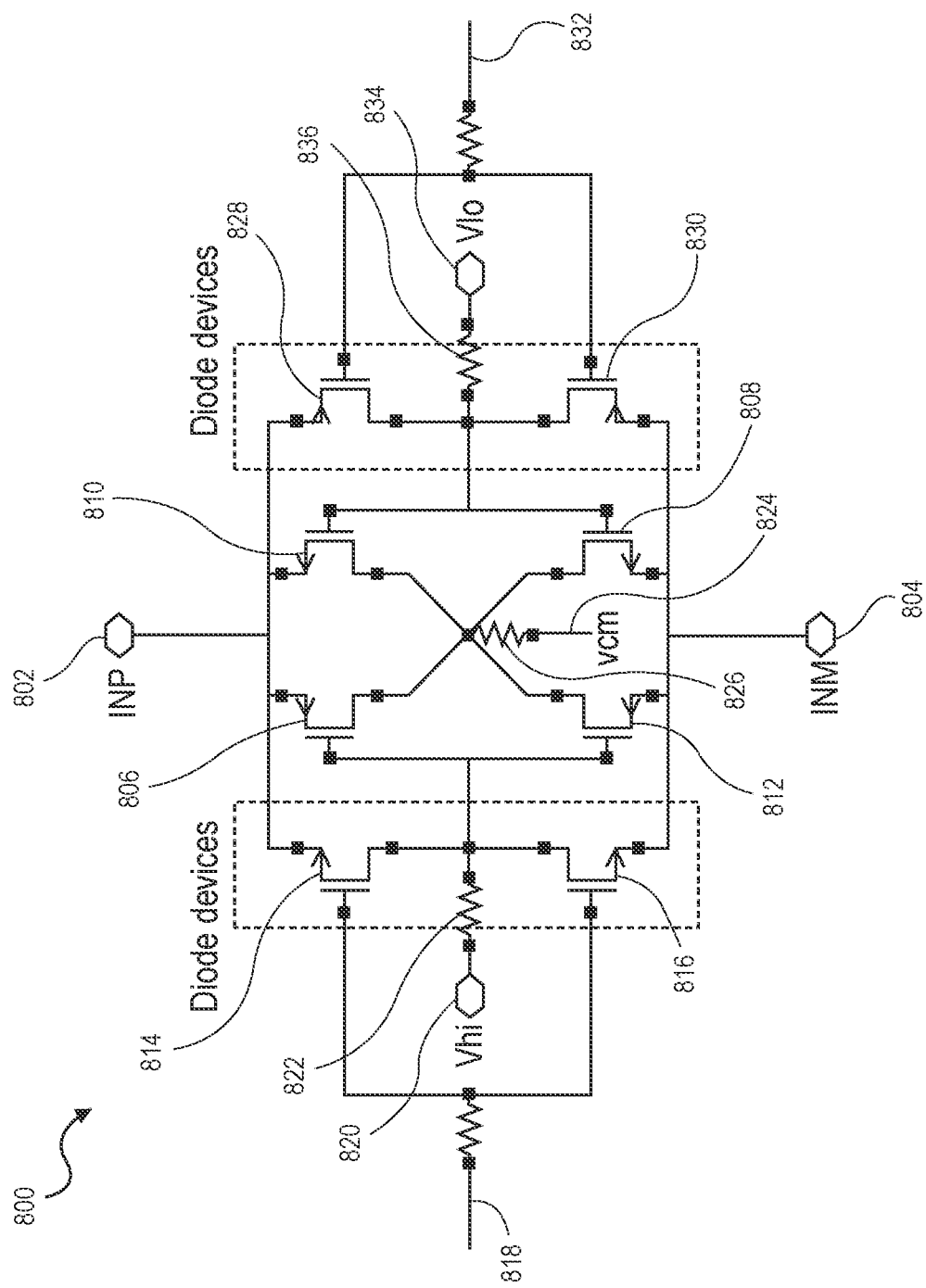
FIG. 8 illustrates another example field effect transistor arrangement, according to various embodiments of the disclosure.

FIG. 8 illustrates another example protection circuitry 800, according to various embodiments of the disclosure. The protection circuitry 800 may act as clamp circuitry for a differential input circuit. For example, a positive input 802 of the protection circuitry 800 may be coupled to a positive component of a differential signal of the differential circuit. A negative input 804 of the protection circuitry 800 may be coupled to a negative component of the differential signal of the differential circuit. The protection circuitry 800 may provide overdrive protection for the differential circuit. For example, the protection circuitry 800 may maintain a voltage difference between a positive component and a negative component of the differential signal within a certain range, where the range may be defined by a threshold voltage of one or more of the transistors within the protection circuitry 800.

The protection circuitry 800 may include a first transistor 806 and a second transistor 808 coupled between the positive input 802 and the negative input 804. In the illustrated embodiment, the first transistor 806 and the second transistor 808 are illustrated as FETs. However, it should be understood that the first transistor 806 and the second transistor 808 may be other types of transistors in other embodiments, such as BJTs. The first transistor 806 may be a p-channel FET and the second transistor 808 may be an n-channel FET. The first transistor 806 may have a source of the first transistor 806 coupled to the positive input 802. A drain of the first transistor 806 may be coupled to a source of the second transistor 808. A drain of the second transistor 808 may be coupled to the negative input 804.

The protection circuitry 800 may further include a third transistor 810 and a fourth transistor 812 coupled between the positive input 802 and the negative input 804. In the illustrated embodiment, the third transistor 810 and the fourth transistor 812 are illustrated as FETs. However, it should be understood that the third transistor 810 and the fourth transistor 812 may be other types of transistors in other embodiments, such as BJTs. The third transistor 810 may be an n-channel FET and the fourth transistor 812 may be a p-channel FET. The third transistor 810 may have a source of the third transistor 810 coupled to the positive input 802. A drain of the third transistor 810 may be coupled to a source of the fourth transistor 812. The drain of the third transistor 810 and the source of the fourth transistor 812 may further be coupled to a common mode node 824 by a resistor 826, where the common mode node 824 may be set to a common mode voltage of the protection circuitry 800. A drain of the fourth transistor 812 may be coupled to the negative input 804.

The protection circuitry 800 may further include a first diode 814 and a second diode 816 coupled between the positive input 802 and the negative input 804. In the illustrated embodiment, the first diode 814 is illustrated as a first transistor and the second diode 816 is illustrated as a second transistor, where the first transistor and the second transistor are biased with a first bias voltage 818 to cause the first transistor and the second transistor to operate as diodes. For consistency with other drawings and description herein, the first diode 814 and the second diode 816 will be described using terminology directed to diodes, such as the anode and cathode of the diode.

A cathode of the first diode 814 may be coupled to the positive input 802 and an anode of the first diode 814 may be coupled to a first threshold voltage 820 via a resistor 822. The first threshold voltage 820 may be a positive voltage, which may be a maximum voltage for operation of the circuit for which the protection circuitry 800 is providing overdrive protection. In some embodiments, the first threshold voltage 820 may be set to voltage that is a threshold voltage of the first transistor 806 and/or a threshold voltage of the fourth transistor 812 below the maximum voltage for operation of the circuit for which the protection circuitry 800 is providing overdrive protection. A cathode of the second diode 816 may be coupled to the negative input 804 and an anode of the second diode 816 may be coupled to the first threshold voltage 820 via the resistor 822. The anode of the first diode 814 and the anode of the second diode 816 may further be coupled to a gate of the first transistor 806 and a gate of the fourth transistor 812.

The first transistor 806 may conduct when a voltage applied to the positive input 802 exceeds a voltage at the gate of the first transistor 806 by a threshold voltage of the first transistor 806. The fourth transistor 812 may conduct when a voltage at applied to the negative input 804 exceeds a voltage at the gate of the fourth transistor 812 by a threshold voltage of the fourth transistor 812. A voltage at the gate of the first transistor 806 and the gate of the fourth transistor 812 may be defined by a voltage applied to the positive input 802, a voltage applied to the negative input 804, or the first threshold voltage 820. In particular, the first diode 814 and the second diode 816 may cause a voltage at the gates of the first transistor 806 and the fourth transistor 812 to be equal to the lower voltage of either the voltage applied to the positive input 802 or the voltage applied to the negative input 804 plus the threshold voltage of the corresponding first diode 814 or the second diode 816 when the voltage applied to the positive input 802 and/or the voltage applied to the negative input 804 are below the first threshold voltage 820. When both the voltage applied to the positive input 802 and the voltage applied to the negative input 804 exceed the first threshold voltage 820, the voltage at the gates of the first transistor 806 and the fourth transistor 812 may be set to the first threshold voltage 820.

The protection circuitry 800 may further include a third diode 828 and a fourth diode 830 coupled between the positive input 802 and the negative input 804. In the illustrated embodiment, the third diode 828 is illustrated as a third transistor and the fourth diode 830 is illustrated as a fourth transistor, where the third transistor and the fourth transistor are biased with a second bias voltage 832 to cause the third transistor and the fourth transistor to operate as diodes. For consistency with other drawings and description herein, the third diode 828 and the fourth diode 830 will be described using terminology directed to diodes, such as the anode and cathode of the diode.

An anode of the third diode 828 may be coupled to the positive input 802 and a cathode of the third diode 828 may be coupled to a second threshold voltage 834 via a resistor 836. The second threshold voltage 834 may be a negative voltage, which may be a minimum voltage for operation of the circuit for which the protection circuitry 800 is providing overdrive protection. In some embodiments, the second threshold voltage 834 may be set to voltage that is a threshold voltage of the second transistor 808 and/or a threshold voltage of the third transistor 810 above the maximum voltage for operation of the circuit for which the protection circuitry 800 is providing overdrive protection. An anode of the fourth diode 830 may be coupled to the negative input 804 and a cathode of the fourth diode 830 may be coupled to the second threshold voltage 834 via the resistor 836. The cathode of the third diode 828 and the cathode of the fourth diode 830 may further be coupled to a gate of the second transistor 808 and a gate of the third transistor 810.

The third transistor 810 may conduct when a voltage applied to the positive input 802 is below a voltage at the gate of the third transistor 810 by a threshold voltage of the third transistor 810. The second transistor 808 may conduct when a voltage applied to the negative input 804 is below a voltage at the gate of the second transistor 808 by a threshold voltage of the second transistor 808. A voltage at the gate of the second transistor 808 and the gate of the third transistor 810 may be defined by a voltage applied to the positive input 802, a voltage applied to the negative input 804, or the second threshold voltage 834. In particular, the third diode 828 and the fourth diode 830 may cause a voltage at the gates of the second transistor 808 and the third transistor 810 to be equal to the higher voltage of either the voltage applied to the positive input 802 or the voltage applied to the negative input 804 minus the threshold voltage of the corresponding third diode 828 or the fourth diode 830 when the voltage applied to the positive input 802 and/or the voltage applied to the negative input 804 exceed the second threshold voltage 834. When both the voltage applied to the positive input 802 and the voltage applied to the negative input 804 are below the second threshold voltage 834, the voltage at the gates of the second transistor 808 and the third transistor 810 may be set to the second threshold voltage 834.

The protection circuitry 800 may operate to keep a voltage difference between a voltage at the positive input 802 and a voltage at the negative input 804 to within a threshold voltage of the transistors (i.e., the first transistor 806, the second transistor 808, the third transistor 810, and/or the fourth transistor 812). Further, the protection circuitry 800 may maintain the voltage at the positive input 802 and the voltage at the negative input 804 equal to each other when both the voltage applied to the positive input 802 and the voltage applied to the negative input 804 exceed the first threshold voltage 820 or are below the second threshold voltage 834. In particular, when a voltage applied to the positive input 802 and a voltage applied to the negative input 804 are within the threshold voltage of the transistors of each other, the first transistor 806, the second transistor 808, the third transistor 810, and the fourth transistor 812 may not conduct current due to a difference of the voltages at the gates of the transistors being less than the threshold voltages of the transistors. Due to the first transistor 806, the second transistor 808, the third transistor 810, and the fourth transistor 812 not conducting, the protection circuitry 800 may not affect the voltages applied to the positive input 802 and the negative input 804.

When a voltage applied to the positive input 802 exceeds a voltage applied to the negative input 804 by the threshold voltage of the transistors, and the voltage applied to the negative input 804 is below the first threshold voltage 820 or the voltage applied to the positive input 802 exceeds the second threshold voltage 834, the protection circuitry 800 may maintain the voltage difference between the voltage at the positive input 802 and the voltage at the negative input 804 to be the threshold voltage of the transistors. In particular, when the voltage applied to the positive input 802 is higher than the voltage applied to the negative input 804, the second diode 816 may be conducting causing the voltage at the gates of the first transistor 806 and the fourth transistor 812 to be equal to the voltage applied to the negative input 804 and the third diode 828 may be conducting causing the voltage at the gates of the second transistor 808 and the third transistor 810 to be equal to the voltage applied to the positive input 802. When the voltage at the gate of first transistor 806 is equal to the voltage applied to the negative input 804 and voltage applied to the positive input 802 exceeds the voltage applied to the negative input 804 by the threshold voltage of the first transistor 806, the first transistor 806 may conduct. Further, when the voltage at the gate of the second transistor 808 is equal to the voltage applied to the positive input 802 and the voltage applied to the positive input 802 exceeds the voltage applied to the negative input 804 by the threshold voltage of the second transistor 808, the second transistor 808 may conduct. With the first transistor 806 and the second transistor 808 conducting, a current path may be formed between the positive input 802 and the negative input 804 via the first transistor 806 and the second transistor 808, thereby tying the positive input 802 and the negative input 804 to each other. The positive input 802 and the negative input 804 being tied together may cause the voltages at the positive input 802 and the negative input 804 to be drawn toward each other, thereby maintaining the voltage difference between the voltages of the positive input 802 and the negative input 804 to be equal to the threshold voltage of the first transistor 806 and/or the second transistor 808.

When a voltage applied to the negative input 804 exceeds a voltage applied to the positive input 802 by the threshold voltage of the transistors, and the voltage applied to the positive input 802 is below the first threshold voltage 820 or the voltage applied to the negative input 804 exceeds the second threshold voltage 834, the protection circuitry 800 may maintain the voltage difference between the voltage at the positive input 802 and the voltage at the negative input 804 to be the threshold voltage of the transistors. In particular, when the voltage applied to the negative input 804 is higher than the voltage applied to the positive input 802, the first diode 814 may be conducting causing the voltage at the gates of the first transistor 806 and the fourth transistor 812 to be equal to the voltage applied to the positive input 802 and the fourth diode 830 may be conducting causing the voltage at the gates of the second transistor 808 and the third transistor 810 to be equal to the voltage applied to the negative input 804. When the voltage applied to the gate of the fourth transistor 812 is equal to the voltage applied to the positive input 802 and the voltage applied to the negative input 804 exceeds the voltage applied to the positive input 802 by the threshold voltage of the fourth transistor 812, the fourth transistor 812 may conduct. Further, when the voltage at the gate of the third transistor 810 is equal to the voltage applied to the negative input 804 and the voltage applied to the negative input 804 exceeds the voltage applied to the positive input 802 by the threshold voltage of the third transistor 810, the third transistor 810 may conduct. With the third transistor 810 and the fourth transistor 812 conducting, a current path may be formed between the positive input 802 and the negative input 804 via the third transistor 810 and the fourth transistor 812, thereby tying the positive input 802 and the negative input 804 to each other. The positive input 802 and the negative input 804 being tied together may cause the voltages at the positive input 802 and the negative input 804 to be drawn toward each other, thereby maintaining the voltage difference between the voltages of the positive input 802 and the negative input 804 to be equal to the threshold voltage of the third transistor 810 and/or the fourth transistor 812.

When a voltage applied to the positive input 802 and a voltage applied to the negative input 804 both exceed the first threshold voltage 820 by the threshold voltage of the transistors, the protection circuitry 800 may maintain the voltage at the positive input 802 and the voltage at the negative input 804 to be equal. In particular, when a voltage applied to the positive input 802 and a voltage applied to the negative input 804 both exceed the first threshold voltage 820 by the threshold voltage of the transistors, the first diode 814 and the second diode 816 may not conduct, causing the voltage at the gates of the first transistor 806 and the fourth transistor 812 to be equal to the first threshold voltage 820. Due to the voltage applied to the positive input 802 and the voltage applied to the negative input 804 both exceeding the first threshold voltage 820 at the gates of the first transistor 806 and the fourth transistor 812 by the threshold voltages of the first transistor 806 and the fourth transistor 812, the first transistor 806 and the fourth transistor 812 may conduct, thereby tying together the positive input 802 and the negative input 804. Accordingly, the voltage at the positive input 802 and the voltage at the negative input 804 may be maintained at the same voltage due to the first transistor 806 and the fourth transistor 812 conducting.

When a voltage applied to the positive input 802 and a voltage applied to the negative input 804 both are below the second threshold voltage 834 by the threshold voltage of the transistors, the protection circuitry 800 may maintain the voltage at the positive input 802 and the voltage at the negative input 804 to be equal. In particular, when a voltage applied to the positive input 802 and a voltage applied to the negative input 804 both are below the first threshold voltage 820 by the threshold voltage of the transistors, the first diode 814 and the second diode 816 may not conduct, causing the voltage at the gates of the second transistor 808 and the third transistor 810 to be equal to the second threshold voltage 834. Due to the voltage applied to the positive input 802 and the voltage applied to the negative input 804 both being below the second threshold voltage 834 at the gates of the second transistor 808 and the third transistor 810 by the threshold voltages of the second transistor 808 and the third transistor 810, the second transistor 808 and the third transistor 810 may conduct, thereby tying together the positive input 802 and the negative input 804. Accordingly, the voltage at the positive input 802 and the voltage at the negative input 804 may be maintained at the same voltage due to the second transistor 808 and the third transistor 810 conducting.

Having two transistors conducting in the states of the protection circuitry 800 may result in greater transconductance than embodiments where a signal transistor is conducting in the states. For example, having the two transistors conducting may double the amount of transconductance as compared to having a single transistor of the same characteristics of each of the two transistors conducting.

Figure 9:
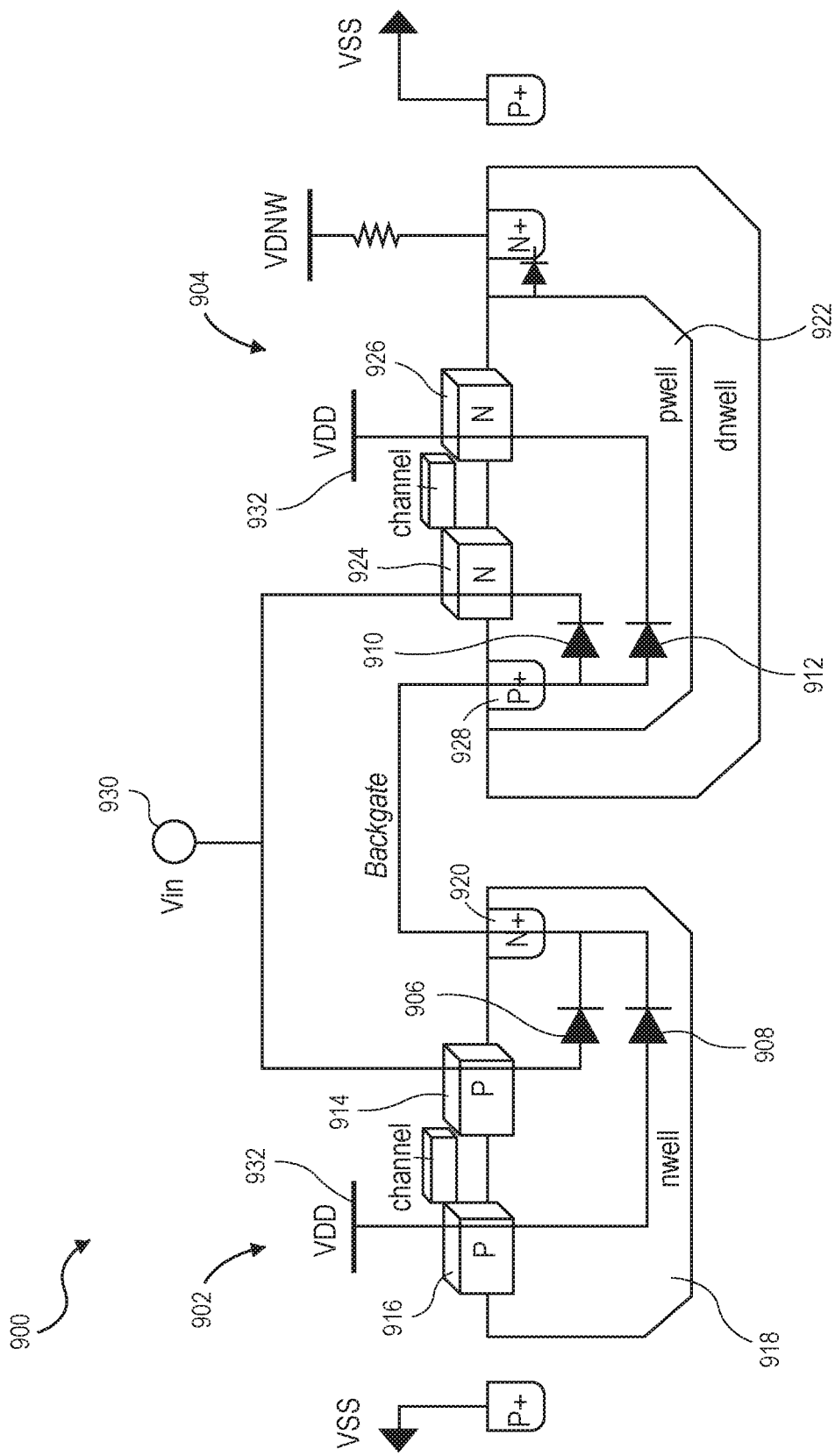
FIG. 9 illustrates an example transistor arrangement, according to various embodiments of the disclosure.

FIG. 9 illustrates an example transistor arrangement 900, according to various embodiments of the disclosure. In particular, the transistor arrangement 900 illustrates a stylized diagram showing connections that may be made between transistors implemented with protection circuitry according to embodiments disclosed herein, such as the protection circuitry 600 (FIG. 6).

The transistor arrangement 900 may include a first transistor 902 and a second transistor 904. The first transistor 902 and the second transistor 904 may comprise any type of transistors, such as FETs or BJTs. The first transistor 902 may comprise a p-channel FET and the second transistor 904 may comprise an n-channel FET.

Representations of each of the diode features of the transistors are shown as diode schematic symbols in the transistor arrangement 900. In particular, the first transistor 902 may include a first diode feature 906 and a second diode feature 908, and the second transistor 904 may include a first diode feature 910 and a second diode feature 912. The diode features of transistors may be formed by a junction between p-doped features of the transistors and n-doped features of the transistors. An anode of a diode feature may be directed toward the p-doped feature of the transistor and a cathode of the diode feature may be directed toward the n-doped feature. The first diode feature 906 may be formed by a junction between a first p-doped portion 914 of the first transistor 902 and an n-well 918 of the first transistor 902, where the first p-doped portion 914 corresponds to a source of the first transistor 902 and the n-well 918 is n-doped. The second diode feature 908 may be formed by a junction between a second p-doped portion 916 of the first transistor 902 and the n-well 918 of the first transistor 902, where the second p-doped portion 916 corresponds to a drain of the first transistor 902. The first diode feature 910 may be formed by a junction between a first n-doped portion 924 of the second transistor 904 and a p-well 922 of the second transistor 904, where the first n-doped portion 924 corresponds to a source of the second transistor 904 and the p-well 922 is p-doped. The second diode feature 912 may be formed by the junction between a second p-doped portion 926 of the second transistor 904 and the p-well 922 of the second transistor 904, where the second p-doped portion 926 corresponds to a drain of the second transistor 904.

The transistor arrangement 900 may have a back gate contact 920 of the first transistor 902 coupled to a back gate contact 928 of the second transistor 904, thereby coupling a back gate of the first transistor 902 to a back gate of the second transistor 904. Coupling the back gate of the first transistor 902 to the back gate of the second transistor 904 may cause cathodes of the first diode feature 906 and the second diode feature 908 to be coupled to anodes of the first diode feature 910 and the second diode feature 912. Accordingly, the first diode feature 906 and the second diode feature 908 may be coupled in series with the first diode feature 910 and the second diode feature 912.

A source of the first transistor 902 may be coupled to an input 930, causing an anode of the first diode feature 906 to be coupled to the input 930. A drain of the second transistor 904 may be coupled to a common mode node (such as the common mode node 618 (FIG. 6)), which is illustrated as being a positive voltage rail 932 (labeled "VDD") in the illustrated embodiment, causing a cathode of the second diode feature 912 to be coupled to the common mode node. Accordingly, the first diode feature 906 of the first transistor 902 and the second diode feature 912 of the second transistor 904 may be coupled in series between the input 930 and the common mode node. Based on the forward directions of the first diode feature 906 and the second diode feature 912, the first diode feature 906 and the second diode feature 912 may conduct current when a voltage of a signal applied to the input 930 exceeds a voltage of the positive voltage rail 932 at the common mode node plus a forward voltage of the first diode feature 906 and a forward voltage of the second diode feature 912. When the first diode feature 906 and the second diode feature 912 are conducting, the first diode feature 906 and the second diode feature 912 may couple the input 930 to the positive voltage rail 932, thereby maintaining a voltage at the input 930 to be the voltage of the positive voltage rail 932 plus the forward voltage of the first diode feature 906 and the forward voltage of the second diode feature 912. Accordingly, the first diode feature 906 and the second diode feature 912 may protect against positive electrostatic discharge causing a voltage at the input 930 from exceeding the voltage of the positive voltage rail 932 plus the forward voltage of the first diode feature 906 and the second diode feature 912.

A source of the second transistor 904 may be coupled to the input 930, causing a cathode of the first diode feature 910 to be coupled to the input 930. A drain of the first transistor 902 may be coupled to a common mode node (such as the common mode node 618 (FIG. 6)), which is illustrated as being a positive voltage rail 932 (labeled "VDD") in the illustrated embodiment, causing an anode of the second diode feature 908 to be coupled to the common mode node. Accordingly, the first diode feature 910 of the second transistor 904 and the second diode feature 908 of the first transistor 902 may be coupled in series between the input 930 and the common mode node. Based on the forward directions of the first diode feature 910 and the second diode feature 908, the first diode feature 910 and the second diode feature 908 may conduct current when a voltage of a signal applied to the input 930 is below the voltage of the positive voltage rail 932 at the common mode node minus a forward voltage of the first diode feature 910 and a forward voltage of the second diode feature 908. When the first diode feature 910 and the second diode feature 908 are conducting, the first diode feature 910 and the second diode feature 908 may couple the input 930 to the positive voltage rail 932, thereby maintaining a voltage at the input 930 to be the voltage of the positive voltage rail 932 minus the forward voltage of the first diode feature 910 and the forward voltage of the second diode feature 908. Accordingly, the first diode feature 910 and the second diode feature 908 may protect against negative electrostatic discharge causing a voltage at the input 930 from being below the voltage of the positive voltage rail 932 minus the forward voltage of the first diode feature 910 and the second diode feature 908.

The first transistor 602 (FIG. 6) and the second transistor 604 (FIG. 6) may be arranged as the transistor arrangement 900 in some embodiments. In particular, the first transistor 602 may have one or more of the features of the first transistor 902, and the second transistor 604 may have one or more of the features of the second transistor 904. A back gate of the first transistor 602 may be coupled to a back gate of the second transistor 604 in a same manner as the back gate of the first transistor 902 is coupled to the back gate of the second transistor 904. Further, the first diode feature 606 (FIG. 6) and the second diode feature 608 (FIG. 6) of the first transistor 602 may be formed via junctions of p-doped features and n-doped features of the first transistor 602 in a same manner the first diode feature 906 and the second diode feature 908 are formed of the junctions of the p-doped features and the n-doped features of the first transistor 902. The first diode feature 610 (FIG. 6) and the second diode feature 612 (FIG. 6) may be formed via junctions of p-doped features and n-doped features of the second transistor 604 in a same manner the first diode feature 910 and the second diode feature 912 are formed of the junctions of the p-doped features and the n-doped features of the second transistor 904.

The transistor arrangement 900 may provide for having a same clamp strength within a smaller area than legacy transistor arrangements. In particular, the first transistor 902 and the second transistor 904 may be located closer together than legacy transistor arrangements. Having the first transistor 902 and the second transistor 904 closer together may minimize parasitics that may be affected by the transistor arrangement 900 upon a circuit in which the transistor arrangement 900 is implemented.

Figure 10:
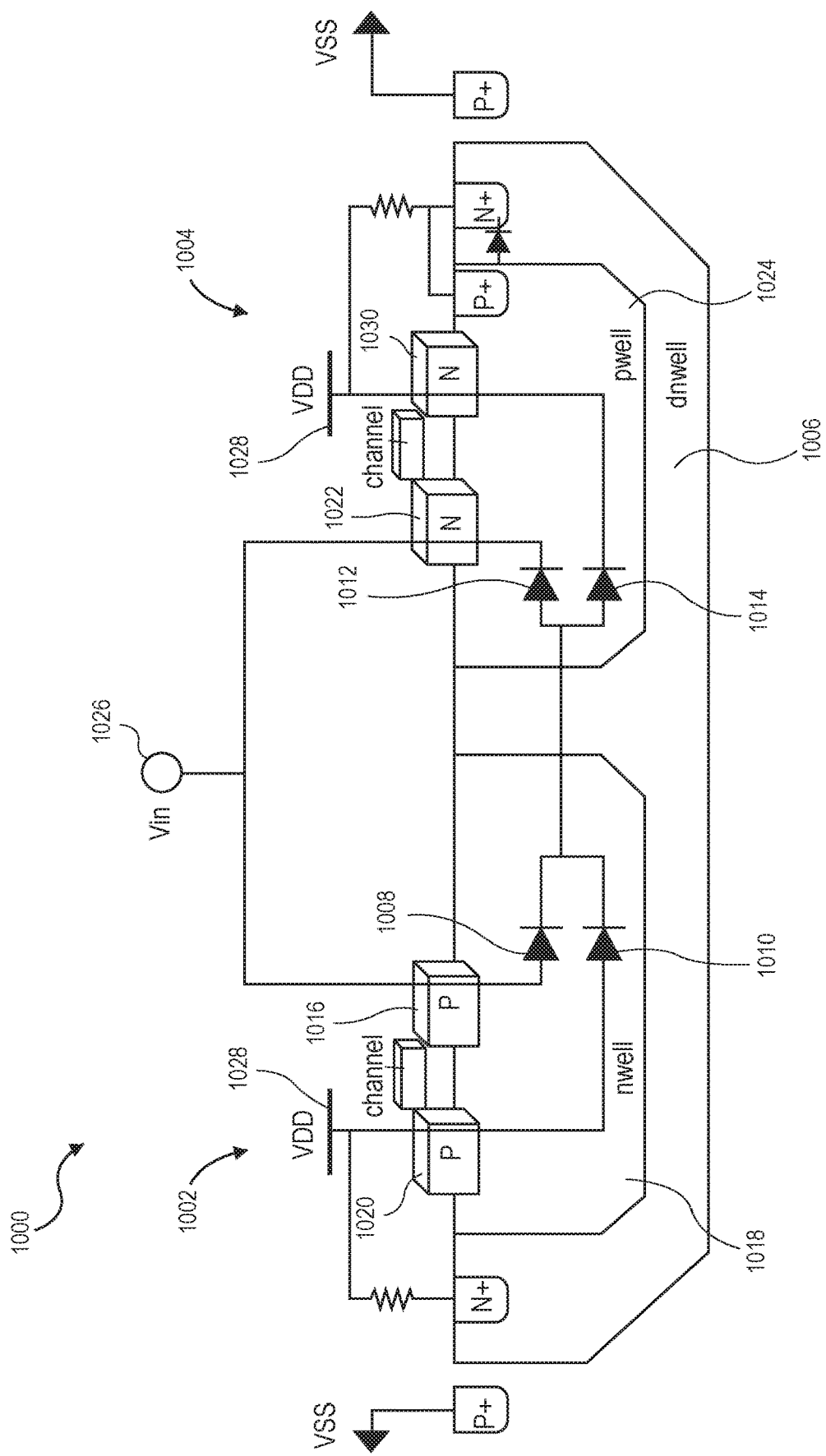
FIG. 10 illustrates another example transistor arrangement, according to various embodiments of the disclosure.

FIG. 10 illustrates another example transistor arrangement 1000, according to various embodiments of the disclosure. In particular, the transistor arrangement 1000 illustrates a stylized diagram showing connections that may be made between transistors implemented with protection circuitry according to embodiments disclosed herein, such as the protection circuitry 600 (FIG. 6).

The transistor arrangement 1000 may include a first transistor 1002 and a second transistor 1004. The first transistor 1002 and the second transistor 1004 may comprise any type of transistors, such as FETs or BJTs. The first transistor 1002 may comprise a p-channel FET and the second transistor 1004 may comprise an n-channel FET. The first transistor 1002 and the second transistor 1004 may share a deep n-well 1006. Sharing of the deep n-well 1006 by the first transistor 1002 and the second transistor 1004 may result in the back gate of the first transistor 1002 and the second transistor 1004 being coupled together.

Representations of each of the diode features of the transistors are shown as diode schematic symbols in the transistor arrangement 1000. In particular, the first transistor 1002 may include a first diode feature 1008 and a second diode feature 1010, and the second transistor 1004 may include a first diode feature 1012 and a second diode feature 1014. The diode features of transistors may be formed by a junction between p-doped features of the transistors and n-doped features of the transistors. An anode of a diode feature may be directed toward the p-doped feature of the transistor and a cathode of the diode feature may be directed toward the n-doped feature. The first diode feature 1008 may be formed by a junction between a first p-doped portion 1016 of the first transistor 1002 and an n-well 1018 of the first transistor 1002, where the first p-doped portion 1016 corresponds to a source of the first transistor 1002 and the n-well 1018 is n-doped. The second diode feature 1010 may be formed by a junction between a second p-doped portion 1020 of the first transistor 1002 and the n-well 1018 of the first transistor 1002, where the second p-doped portion 1020 corresponds to a drain of the first transistor 1002. The first diode feature 1012 may be formed by a junction between a first n-doped portion 1022 of the second transistor 1004 and a p-well 1024 of the second transistor 1004, where the first n-doped portion 1022 corresponds to a source of the second transistor 1004 and the p-well 1024 is p-doped. The second diode feature 1014 may be formed by the junction between a second n-doped portion 1030 of the second transistor 1004 and the p-well 1024 of the second transistor 1004, where the second n-doped portion 1030 corresponds to a drain of the second transistor 1004.

The transistor arrangement 1000 may have a back gate of the first transistor 1002 and a back gate of the second transistor 1004 coupled via the shared deep n-well 1006. For example, current may pass between the back gate of the first transistor 1002 and the back gate of the second transistor 1004 through the deep n-well 1006 rather than having external connections. Coupling the back gate of the first transistor 1002 to the back gate of the second transistor 1004 may cause cathodes of the first diode feature 1008 and the second diode feature 1010 to be coupled to anodes of the first diode feature 1012 and the second diode feature 1014. Accordingly, the first diode feature 1008 and the second diode feature 1010 may be coupled in series with the first diode feature 1012 and the second diode feature 1014.

A source of the first transistor 1002 may be coupled to an input 1026, causing an anode of the first diode feature 1008 to be coupled to the input 1026. A drain of the second transistor 1004 may be coupled to a common mode node (such as the common mode node 618 (FIG. 6)), which is illustrated as being a positive voltage rail 1028 (labeled "VDD") in the illustrated embodiment, causing a cathode of the second diode feature 1014 to be coupled to the common mode node. Accordingly, the first diode feature 1008 of the first transistor 1002 and the second diode feature 1014 of the second transistor 1004 may be coupled in series between the input 1026 and the common mode node. Based on the forward directions of the first diode feature 1008 and the second diode feature 1014, the first diode feature 1008 and the second diode feature 1014 may conduct current when a voltage of a signal applied to the input 1026 exceeds a voltage of the positive voltage rail 1028 at the common mode node plus a forward voltage of the first diode feature 1008 and a forward voltage of the second diode feature 1014. When the first diode feature 1008 and the second diode feature 1014 are conducting, the first diode feature 1008 and the second diode feature 1014 may couple the input 1026 to the positive voltage rail 1028, thereby maintaining a voltage at the input 1026 to be a voltage of the positive voltage rail 1028 plus the forward voltage of the first diode feature 1008 and the forward voltage of the second diode feature 1014. Accordingly, the first diode feature 1008 and the second diode feature 1014 may protect against positive electrostatic discharge causing a voltage at the input 1026 from exceeding the voltage of the positive voltage rail 1028 plus the forward voltage of the first diode feature 1008 and the second diode feature 1014.

A source of the second transistor 1004 may be coupled to the input 1026, causing a cathode of the first diode feature 1012 to be coupled to the input 1026. A drain of the first transistor 1002 may be coupled to a common mode node (such as the common mode node 618 (FIG. 6)), which is illustrated as being a positive voltage rail 1028 (labeled "VDD") in the illustrated embodiment, causing an anode of the second diode feature 1010 to be coupled to the common mode node. Accordingly, the first diode feature 1012 of the second transistor 1004 and the second diode feature 1010 of the first transistor 1002 may be coupled in series between the input 1026 and the common mode node. Based on the forward directions of the first diode feature 1012 and the second diode feature 1010, the first diode feature 1012 and the second diode feature 1010 may conduct current when a voltage of a signal applied to the input 1026 is below the voltage of the positive voltage rail 1028 at the common mode node minus a forward voltage of the first diode feature 1012 and a forward voltage of the second diode feature 1010. When the first diode feature 1012 and the second diode feature 1010 are conducting, the first diode feature 1012 and the second diode feature 1010 may couple the input 1026 to the positive voltage rail 1028, thereby maintaining a voltage at the input 1026 to be the positive voltage rail 1028 minus the forward voltage of the first diode feature 1012 and the forward voltage of the second diode feature 1010. Accordingly, the first diode feature 1012 and the second diode feature 1010 may protect against negative electrostatic discharge causing a voltage at the input 1026 from being below the positive voltage rail 1028 minus the forward voltage of the first diode feature 1012 and the second diode feature 1010.

The first transistor 602 (FIG. 6) and the second transistor 604 (FIG. 6) may be arranged as the transistor arrangement 1000 in some embodiments. In particular, the first transistor 602 may have one or more of the features of the first transistor 1002, and the second transistor 604 may have one or more of the features of the second transistor 1004. A back gate of the first transistor 602 may be coupled to a back gate of the second transistor 604 via a deep n-well in a same manner as the back gate of the first transistor 1002 is coupled to the back gate of the second transistor 1004 via the deep n-well 1006. Further, the first diode feature 606 (FIG. 6) and the second diode feature 608 (FIG. 6) of the first transistor 602 may be formed via junctions of p-doped features and n-doped features of the first transistor 602 in a same manner the first diode feature 1008 and the second diode feature 1010 are formed of the junctions of the p-doped features and the n-doped features of the first transistor 1002. The first diode feature 610 (FIG. 6) and the second diode feature 612 (FIG. 6) may be formed via junctions of p-doped features and n-doped features of the second transistor 604 in a same manner the first diode feature 1012 and the second diode feature 1014 are formed of the junctions of the p-doped features and the n-doped features of the second transistor 1004.

The transistor arrangement 1000 may provide for having a same clamp strength within a smaller area than legacy transistor arrangements. In particular, the first transistor 1002 and the second transistor 1004 may be located closer together than legacy transistor arrangements. Having the first transistor 1002 and the second transistor 1004 closer together may minimize parasitics that may be affected by the transistor arrangement 1000 upon a circuit in which the transistor arrangement 1000 is implemented. In particular, having the shared deep n-well 1006 may allow the first transistor 1002 and the second transistor 1004 to be located closer together in a layout than legacy transistor arrangements, which can substantially drop the parasitics presented by the interconnects of the first transistor 1002 and the second transistor 1004.

While the protection circuitry illustrated and described throughout this disclosure show an input, it should be understood that the protection circuitry can be implemented for input/output of a circuit. In particular, the inputs of the protection circuitry described throughout can be replaced by outputs or combined inputs and outputs in other embodiments.

Within the description, the terms "positive voltage rail" and "negative voltage rail," are utilized throughout to describe an upper voltage source coupled to the protection circuitry and a lower voltage source coupled to the protection circuitry. It should be understood that the "positive voltage rail" and the "negative voltage rail" refer to a relationship between the voltages of the "positive voltage rail" and the "negative voltage rail," and that the terms should not be interpreted to limit the voltages of each being limited to positive voltages and negative voltages, respectively. For example, the "negative voltage rail" may have a voltage of 0 volts and the "positive voltage rail" may have a voltage greater than 0 volts in some embodiments.

EXAMPLE IMPLEMENTATIONS

The following examples are provided by way of illustration.

Example 1 may include input/output protection circuitry for a device, comprising a first transistor to be coupled between an input/output of the device and a common mode node of the device, the common mode node to be set to a common mode voltage for the device, wherein the first transistor is to conduct current between the input/output and the common mode node when a voltage on the input/output exceeds a first threshold voltage, and a second transistor to be coupled between the input/output and the common mode node, wherein the second transistor is to conduct current between the input/output and the common mode node when the voltage on the input/output is below a second threshold voltage.

Example 2 may include the input/output protection circuitry of example 1, wherein the first transistor comprises a first field effect transistor (FET) or a first bipolar junction transistor (BJT), and the second transistor comprises a second FET or a second BJT.

Example 3 may include the input/output protection circuitry of example 1, wherein the first transistor comprises a p-channel field effect transistor (FET), and the second transistor comprises an n-channel FET.

Example 4 may include the input/output protection circuitry of example 3, wherein a source of the p-channel FET is to be coupled to the input/output and a drain of the p-channel FET is to be coupled to the common mode node, and a source of the n-channel FET is to be coupled to the input/output and a drain of the n-channel FET is to be coupled to the common mode node.

Example 5 may include the input/output protection circuitry of example 1, wherein the first transistor is to have the first threshold voltage applied to a gate of the first transistor, and the second transistor is to have the second threshold voltage applied to a gate of the second transistor.

Example 6 may include the input/output protection circuitry of example 1, wherein a back gate of the first transistor is coupled to a back gate of the second transistor, a first diode feature of the first transistor and a first diode feature of the second transistor is to provide electrostatic discharge protection for positive electrostatic discharge based on the back gate of the first transistor being coupled to the back gate of the second transistor, and a second diode feature of the first transistor and a second diode feature of the second transistor is to provide electrostatic discharge protection for negative electrostatic discharge based on the back gate of the first transistor being coupled to the back gate of the second transistor.

Example 7 may include the input/output protection circuitry of example 6, wherein the first transistor and the second transistor share a deep n-well, and junctions of an n-well of the first transistor with the deep n-well and of a p-well of the second transistor with the deep n-well form the first diode feature of the first transistor, the first diode feature of the second transistor, the second diode feature of the first transistor, and the second diode feature of the second transistor.

Example 8 may include the input/output protection circuitry of example 1, further comprising a third transistor coupled to a gate of the first transistor and the third transistor to be coupled to the input/output, wherein the third transistor is to conduct current when the voltage on the input/output exceeds the first threshold voltage, and a fourth transistor coupled to a gate of the second transistor and the third transistor to be coupled to the input/output, wherein the fourth transistor is to conduct current when the voltage on the input/output is below the second threshold voltage.

Example 9 may include the input/output protection circuitry of example 8, further comprising a first resistor to be coupled between the third transistor and a first node to which the first threshold voltage is to be applied, wherein the first resistor is further to be coupled between the first transistor and the first node, and wherein the first resistor is to produce a first voltage drop from the first threshold voltage when the third transistor conducts current, and a second resistor to be coupled between the fourth transistor and a second node to which the second threshold voltage is to be applied, wherein the second resistor is further to be coupled between the second transistor and the second node, and wherein the second resistor is to produce a second voltage drop from the second threshold voltage when the fourth transistor conducts current.

Example 10 may include the input/output protection circuitry of example 8, wherein the first threshold voltage is to be applied to a gate of the third transistor, a source of the third transistor is to be coupled to the input/output, the third transistor is to conduct current when a voltage of the input/output exceeds the first threshold voltage, the second threshold voltage is to be applied to a gate of the fourth transistor, a source of the fourth transistor is to be coupled to the input/output; and the third transistor is to conduct current when a voltage at the source of the fourth transistor exceeds the second threshold voltage.

Example 11 may include a radio frequency (RF) circuit, comprising electrostatic discharge protection circuitry coupled to an input/output of the RF circuit, the electrostatic discharge protection circuitry to protect the RF circuit from electrostatic discharge on the input/output, and overdrive protection circuitry coupled to the input/output, the overdrive protection circuitry to protect the RF circuit from overdrive on the input/output, wherein the overdrive protection circuitry comprises a first transistor coupled to the input/output, the first transistor to discharge a positive overdrive on the input/output when a voltage applied to the input/output exceeds a first threshold voltage, and a second transistor coupled to the input/output, the second transistor to discharge a negative overdrive on the input/output when the voltage applied to the input/output is below a second threshold voltage.

Example 12 may include the RF circuit of example 11, wherein the first transistor is coupled between the input/output and a common mode node for the RF circuit, the common mode node to be set to a common node voltage for the RF circuit, and the second transistor is coupled between the input/output and the common mode node.

Example 13 may include the RF circuit of example 12, wherein a gate of the first transistor is to receive the first threshold voltage, the first transistor to conduct current when the voltage applied to input/output exceeds the first threshold voltage, and a gate of the second transistor is to receive the second threshold voltage, the second transistor to conduct current when the voltage applied to the input/output exceeds the second threshold voltage.

Example 14 may include the RF circuit of example 12, wherein the first transistor comprises a p-channel field effect transistor (FET), a source of the p-channel FET is coupled to the input/output and a drain of the p-channel FET is coupled to the common mode node, the second transistor comprises an n-channel FET, and a source of the n-channel FET is coupled to the input/output and a drain of the n-channel FET is coupled to the common mode node.

Example 15 may include the RF circuit of example 12, wherein the electrostatic discharge protection circuitry comprises a first diode feature of the first transistor, a first diode feature of the second transistor, the first diode feature of the first transistor coupled to the first diode feature of the second transistor via a back gate of the first transistor being coupled to a back gate of the second transistor, the first diode feature of the first transistor and the first diode feature of the second transistor to conduct current when a positive electrostatic discharge is applied to the input/output, a second diode feature of the first transistor, and a second diode feature of the second transistor, the second diode feature of the second transistor coupled to the second diode feature of the second transistor via the back gate of the first transistor being coupled to the back gate of the second transistor, the second diode feature of the second transistor and the second diode feature of the second transistor to conduct current when a negative electrostatic discharge is applied to the input/output.

Example 16 may include the RF circuit of example 15, wherein the first transistor and the second transistor share a deep n-well, and the back gate of the first transistor and the back gate of the second transistor are coupled via the deep n-well.

Example 17 may include the RF circuit of example 12, wherein the overdrive protection circuitry further comprises a third transistor coupled to the input/output and to a gate of the first transistor, the third transistor to further facilitate discharge of the positive overdrive, and a fourth transistor coupled to the input/output and a gate of the second transistor, the fourth transistor to further facilitate discharge of the positive overdrive.

Example 18 may include the RF circuit of example 17, wherein a source of the third transistor is coupled to the input/output and a drain of the third transistor is coupled a first node to which the first threshold voltage is applied, the first transistor to discharge the positive overdrive to the common mode node and the third transistor to discharge the positive overdrive to the first node, and a source of the fourth transistor is coupled to the input/output and a drain of the fourth transistor is coupled to a second node to which the second threshold voltage is applied, the second transistor to discharge the negative overdrive to the common mode node and the fourth transistor to discharge the negative overdrive to the second node.

Example 19 may include differential protection circuitry for a device, comprising a first transistor coupled between a positive input coupled to a positive component of a differential input and a negative input coupled to a negative component of the differential input, the first transistor to couple the positive input to the negative input when a voltage at the positive input exceeds a voltage at the negative input by a threshold voltage of the first transistor, and a second transistor coupled between the positive input and the negative input, the second transistor to couple the positive input to the negative input when the voltage at the negative input exceeds the voltage at the positive input by a threshold voltage of the second transistor.

Example 20 may include the differential protection circuitry of example 19, further comprising a first diode coupled between a gate of the first transistor and the positive input, wherein an anode of the first diode is coupled to the gate of the first transistor and a cathode of the first diode is coupled to the positive input, and a second diode coupled between the gate of the first transistor and the negative input, wherein an anode of the second diode is coupled to the gate of the first transistor and a cathode of the second diode is coupled to the negative input.

Example 21 may include the differential protection circuitry of example 19, further comprising a first diode coupled between a gate of the second transistor and the positive input, wherein an anode of the first diode is coupled to the positive input and a cathode of the first diode is coupled to the gate of the second transistor, and a second diode coupled between the gate of the second transistor and the negative input, wherein an anode of the second diode is coupled to the negative input and a cathode of the second diode is coupled to the gate of the second transistor.

Example 22 may include the differential protection circuitry of example 19, wherein the first transistor comprises a p-channel field effect transistor (FET), and wherein the second transistor comprises an n-channel FET.

Example 23 may include the differential protection circuitry of example 19, wherein a source of the first transistor is coupled to the positive input and a drain of the first transistor is coupled to the negative input, and wherein a source of the second transistor is coupled to the positive input and a drain of the second transistor is coupled to the negative input.

Example 24 may include the differential protection circuitry of example 19, further comprising a third transistor coupled between the first transistor and the negative input, the third transistor to couple the first transistor to the negative input when the voltage at the positive input exceeds a voltage at the negative input by a threshold voltage of the third transistor, and a fourth transistor coupled between the second transistor and the negative input, the fourth transistor to couple the second transistor to the negative input when the voltage at the negative input exceeds the voltage at the positive input by a threshold voltage of the fourth transistor.

Example 25 may include the differential protection circuitry of example 24, wherein the first transistor comprises a p-channel field effect transistor (FET), wherein the second transistor comprises an n-channel FET, wherein the third transistor comprises an n-channel FET, and wherein the fourth transistor comprises a p-channel FET.

Example 26 may include the differential protection circuitry of example 24, further comprising a first diode coupled between the positive input and gates of the first transistor and the third transistor, wherein an anode of the first diode is coupled to the gates of the first transistor and the third transistor and a cathode of the first diode is coupled to the positive input, and a second diode coupled between the negative input and the gates of the first transistor and the third transistor, wherein an anode of the second diode is coupled to the gates of the first transistor and the third transistor and a cathode of the second diode is coupled to the negative input.

Example 27 may include the differential protection circuitry of example 24, further comprising a first diode coupled between the positive input and gates of the second transistor and the fourth transistor, wherein an anode of the first diode is coupled to the positive input and a cathode of the first diode is coupled to the gates of the second transistor and the fourth transistor, and a second diode coupled between the negative input and the gates of the first transistor and the third transistor, wherein an anode of the second diode is coupled to the gates of the first transistor and the third transistor and a cathode of the second diode is coupled to the negative input.

Example 28 may include the differential protection circuitry of example 24, wherein a source of the first transistor is coupled to the positive input and a drain of the first transistor is coupled to a drain of the third transistor, wherein a source of the third transistor is coupled to the negative input, wherein a source of the second transistor is coupled to the positive input and a drain of the second transistor is coupled to a drain of the fourth transistor, and wherein a source of the fourth transistor is coupled to the negative input.

Example 29 may include an input/output protection circuitry for a device, comprising a first field effect transistor (FET) to be coupled between an input/output of the device and a common mode node of the device, the common mode node to be set to a common mode voltage for the device, wherein the first FET is to conduct current between the input/output and the common mode node when a voltage on the input/output exceeds a first threshold voltage, and a second FET to be coupled between the input/output and the common mode node, wherein the second FET is to conduct current between the input/output and the common mode node when the voltage on the input/output is below a second threshold voltage.

Example 30 may include the input/output protection circuitry of example 29, wherein the first FET comprises an p-channel FET, and the second FET comprises an n-channel FET.

Example 31 may include the input/output protection circuitry of example 30, wherein a source of the p-channel FET is to be coupled to the input/output and a drain of the p-channel FET is to be coupled to the common mode node, and a source of the n-channel FET is to be coupled to the input/output and a drain of the n-channel FET is to be coupled to the common mode node.

Example 32 may include the input/output protection circuitry of example 29, wherein the first FET is to have the first threshold voltage applied to a gate of the first FET, and the second FET is to have the second threshold voltage applied to a gate of the second FET.

Example 33 may include the input/output protection circuitry of example 29, wherein a back gate of the first FET coupled to a back gate of the second FET, a first diode feature of the first FET and a first diode feature of the second FET is to provide electrostatic discharge protection for positive electrostatic discharge based on the back gate of the first FET being coupled to the back gate of the second FET, and a second diode feature of the first FET and a second diode feature of the second FET is to provide electrostatic discharge protection for negative electrostatic discharge based on the back gate of the first FET being coupled to the back gate of the second FET.

Example 34 may include the input/output protection circuitry of example 33, wherein the first FET and the second FET share a deep n-well, and junctions of an n-well of the first FET with the deep n-well and of a p-well of the second FET with the deep n-well form the first diode feature of the first FET, the first diode feature of the second FET, the second diode feature of the first FET, and the second diode feature of the second FET.

Example 35 may include the input/output protection circuitry of example 33, further comprising a first diode coupled between the input/output and a positive voltage rail of the input/output protection circuitry, wherein the first diode is to further provide electrostatic discharge protection for positive electrostatic discharge, and a second diode coupled between the input/output and a negative voltage rail of the input/output protection circuitry, wherein the second diode is to further provide electrostatic discharge protection for negative electrostatic discharge.

Example 36 may include the input/output protection circuitry of example 29, further comprising a third FET coupled to a gate of the first FET and the third FET to be coupled to the input/output, wherein the third FET is to conduct current when the voltage on the input/output exceeds the first threshold voltage, and a fourth FET coupled to a gate of the second FET and the third FET to be coupled to the input/output, wherein the fourth FET is to conduct current when the voltage on the input/output is below the second threshold voltage.

Example 37 may include the input/output protection circuitry of example 36, further comprising a first resistor to be coupled between the third FET and a first node to which the first threshold voltage is to be applied, wherein the first resistor is further to be coupled between the first FET and the first node, and wherein the first resistor is to produce a first voltage drop from the first threshold voltage when the third FET conducts current, and a second resistor to be coupled between the fourth FET and a second node to which the second threshold voltage is to be applied, wherein the second resistor is further to be coupled between the second FET and the second node, and wherein the second resistor is to produce a second voltage drop from the second threshold voltage when the fourth FET conducts current.

Example 38 may include the input/output protection circuitry of example 36, wherein the first threshold voltage is to be applied to a gate of the third FET, a source of the third FET is to be coupled to the input/output, the third FET is to conduct current when a voltage of the input/output exceeds the first threshold voltage, the second threshold voltage is to be applied to a gate of the fourth FET, a source of the fourth FET is to be coupled to the input/output, and the third FET is to conduct current when a voltage at the source of the fourth FET exceeds the second threshold voltage.

Example 39 may include the input/output protection circuitry of example 36, wherein the first FET comprises a p-channel FET, the second FET comprises an n-channel FET, the third FET comprises an n-channel FET, and the fourth FET comprises a p-channel FET.

Example 40 may include the input/output protection circuitry of example 39, wherein a source of the third FET is to be coupled to the input/output, a drain of the third FET is coupled to a gate of the first FET, a source of the fourth FET is to be coupled to the input/output, and a drain of the fourth FET is coupled to a gate of the second FET.

Example 41 may include a radio frequency (RF) circuit, comprising electrostatic discharge protection circuitry coupled to an input/output of the RF circuit, the electrostatic discharge protection circuitry to protect the RF circuit from electrostatic discharge on the input/output, and overdrive protection circuitry coupled to the input/output, the overdrive protection circuitry to protect the RF circuit from overdrive on the input/output, wherein the overdrive protection circuitry comprises a first diode element coupled to the input/output, the first diode element to discharge a positive overdrive on the input/output when a voltage applied to the input/output exceeds a first threshold voltage, and a second diode element coupled to the input/output, the second diode element to discharge a negative overdrive on the input/output when the voltage applied to the input/output is below a second threshold voltage.

Example 42 may include the RF circuit of example 33, wherein the first diode element comprises a first field effect transistor (FET) coupled between the input/output and a common mode node for the RF circuit, the common mode node to be set to a common node voltage for the RF circuit, and the second diode element comprises a second FET coupled between the input/output and the common mode node.

Example 43 may include the RF circuit of example 42, wherein a gate of the first FET is to receive the first threshold voltage, the first FET to conduct current when the voltage applied to input/output exceeds the first threshold voltage, and a gate of the second FET is to receive the second threshold voltage, the second FET to conduct current when the voltage applied to the input/output exceeds the second threshold voltage.

Example 44 may include the RF circuit of example 42, wherein the first FET comprises a p-channel FET, a source of the p-channel FET is coupled to the input/output and a drain of the p-channel FET is coupled to the common mode node, the second FET comprises an n-channel FET, and a source of the n-channel FET is coupled to the input/output and a drain of the n-channel FET is coupled to the common mode node.

Example 45 may include the RF circuit of example 42, wherein the electrostatic discharge protection circuitry comprises a first diode feature of the first FET, a first diode feature of the second FET, the first diode feature of the first FET coupled to the first diode feature of the second FET via a back gate of the first FET being coupled to a back gate of the second FET, the first diode feature of the first FET and the first diode feature of the second FET to conduct current when a positive electrostatic discharge is applied to the input/output, a second diode feature of the first FET, and a second diode feature of the second FET, the second diode feature of the second FET coupled to the second diode feature of the second FET via the back gate of the first FET being coupled to the back gate of the second FET, the second diode feature of the second FET and the second diode feature of the second FET to conduct current when a negative electrostatic discharge is applied to the input/output.

Example 46 may include the RF circuit of example 45, wherein the first FET and the second FET share a deep n-well, and the back gate of the first FET and the back gate of the second FET are coupled via the deep n-well.

Example 47 may include the RF circuit of example 42, wherein the overdrive protection circuitry further comprises a third FET coupled to the input/output and to a gate of the first FET, the third FET to further facilitate discharge of the positive overdrive, and a fourth FET coupled to the input/output and a gate of the second FET, the fourth FET to further facilitate discharge of the positive overdrive.

Example 48 may include the RF circuit of example 47, wherein a source of the third FET is coupled to the input/output and a drain of the third FET is coupled a first node to which the first threshold voltage is applied, the first FET to discharge the positive overdrive to the common mode node and the third FET to discharge the positive overdrive to the first node, and a source of the fourth FET is coupled to the input/output and a drain of the fourth FET is coupled to a second node to which the second threshold voltage is applied, the second FET to discharge the negative overdrive to the common mode node and the fourth FET to discharge the negative overdrive to the second node.

Example 49 may include differential protection circuitry for a device, comprising a first field effect transistor (FET) coupled between a positive input coupled to a positive component of a differential input and a negative input coupled to a negative component of the differential input, the first FET to couple the positive input to the negative input when a voltage at the positive input exceeds a voltage at the negative input by a threshold voltage of the first FET, and a second FET coupled between the positive input and the negative input, the second FET to couple the positive input to the negative input when the voltage at the negative input exceeds the voltage at the positive input by a threshold voltage of the second FET.

Example 50 may include the differential protection circuitry of example 49, further comprising a first diode coupled between a gate of the first FET and the positive input, wherein an anode of the first diode is coupled to the gate of the first FET and a cathode of the first diode is coupled to the positive input, and a second diode coupled between the gate of the first FET and the negative input, wherein an anode of the first diode is coupled to the gate of the first FET and a cathode of the second diode is coupled to the negative input.

Example 51 may include the differential protection circuitry of example 49, further comprising a first diode coupled between a gate of the second FET and the positive input, wherein an anode of the first diode is coupled to the positive input and a cathode of the first diode is coupled to the gate of the second FET, and a second diode coupled between the gate of the second FET and the negative input, wherein an anode of the second diode is coupled to the negative input and a cathode of the second diode is coupled to the gate of the second FET.

Example 52 may include the differential protection circuitry of example 49, wherein the first FET comprises a p-channel FET, and wherein the second FET comprises an n-channel FET.

Example 53 may include the differential protection circuitry of example 49, wherein a source of the first FET is coupled to the positive input and a drain of the first FET is coupled to the negative input, and wherein a source of the second FET is coupled to the positive input and a drain of the second FET is coupled to the negative input.

Example 54 may include the differential protection circuitry of example 49, further comprising a third FET coupled between the first FET and the negative input, the third FET to couple the first FET to the negative input when the voltage at the positive input exceeds a voltage at the negative input by a threshold voltage of the third FET, and a fourth FET coupled between the second FET and the negative input, the fourth FET to couple the second FET to the negative input when the voltage at the negative input exceeds the voltage at the positive input by a threshold voltage of the fourth FET.

Example 55 may include the differential protection circuitry of example 54, wherein the first FET comprises a p-channel FET, wherein the second FET comprises an n-channel FET, wherein the third FET comprises an n-channel FET, and wherein the fourth FET comprises a p-channel FET.

Example 56 may include the differential protection circuitry of example 54, further comprising a first diode coupled between the positive input and gates of the first FET and the third FET, wherein an anode of the first diode is coupled to the gates of the first FET and the third FET and a cathode of the first diode is coupled to the positive input, and a second diode coupled between the negative input and the gates of the first FET and the third FET, wherein an anode of the second diode is coupled to the gates of the first FET and the third FET and a cathode of the second diode is coupled to the negative input.

Example 57 may include the differential protection circuitry of example 54, further comprising a first diode coupled between the positive input and gates of the second FET and the fourth FET, wherein an anode of the first diode is coupled to the positive input and a cathode of the first diode is coupled to the gates of the second FET and the fourth FET, and a second diode coupled between the negative input and the gates of the first FET and the third FET, wherein an anode of the second diode is coupled to the gates of the first FET and the third FET and a cathode of the second diode is coupled to the negative input.

Example 58 may include the differential protection circuitry of example 54, wherein a source of the first FET is coupled to the positive input and a drain of the first FET is coupled to a drain of the third FET, wherein a source of the third FET is coupled to the negative input, wherein a source of the second FET is coupled to the positive input and a drain of the second FET is coupled to a drain of the fourth FET, and wherein a source of the fourth FET is coupled to the negative input.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data. Certain embodiments can relate to multi-DSP, multi-ASIC, or multi-SoC signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include, for example, pulmonary monitors, accelerometers, heart rate monitors, or pacemakers, along with peripherals therefor. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion, rendering, and display products in battery monitoring, control systems, reporting controls, maintenance activities, and others. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. Input/output protection circuitry comprising:
a first transistor to be coupled between an input/output of the device and a common mode node of the device, the common mode node to be set to a common mode voltage for the device, wherein the first transistor is to conduct current between the input/output and the common mode node when a voltage on the input/output exceeds a first threshold voltage;
a second transistor to be coupled between the input/output and the common mode node, wherein the second transistor is to conduct current between the input/output and the common mode node when the voltage on the input/output is below a second threshold voltage;
a third transistor coupled to a gate of the first transistor and the third transistor to be coupled to the input/output, wherein the third transistor is to conduct current when the voltage on the input/output exceeds the first threshold voltage, wherein the first threshold voltage is to be applied to a gate of the third transistor, wherein a source of the third transistor is to be coupled to the input/output, and wherein the third transistor is to conduct current when the voltage on the input/output exceeds the first threshold voltage; and
a fourth transistor coupled to a gate of the second transistor and the fourth transistor to be coupled to the input/output, wherein the fourth transistor is to conduct current when the voltage on the input/output is below the second threshold voltage, wherein the second threshold voltage is to be applied to a gate of the fourth transistor, wherein a source of the fourth transistor is to be coupled to the input/output, and wherein the third transistor is to conduct current when a voltage at the source of the fourth transistor exceeds the second threshold voltage.

2. The input/output protection circuitry of claim 1, further comprising
a termination resistor coupled between the input/output and the common mode node.

3. The input/output protection circuitry of claim 1, wherein:
the first transistor comprises a p-channel field effect transistor (FET); and
the second transistor comprises an n-channel FET.

4. The input/output protection circuitry of claim 3, wherein:
a source of the p-channel FET is to be coupled to the input/output and a drain of the p-channel FET is to be coupled to the common mode node; and
a source of the n-channel FET is to be coupled to the input/output and a drain of the n-channel FET is to be coupled to the common mode node.

5. Input/output protection circuitry comprising:
a first transistor to be coupled between an input/output of the device and a common mode node of the device, the common mode node to be set to a common mode voltage for the device, wherein the first transistor is to conduct current between the input/output and the common mode node when a voltage on the input/output exceeds a first threshold voltage;
a second transistor to be coupled between the input/output and the common mode node, wherein the second transistor is to conduct current between the input/output and the common mode node when the voltage on the input/output is below a second threshold voltage;
a third transistor coupled to a gate of the first transistor and the third transistor to be coupled to the input/output, wherein the third transistor is to conduct current when the voltage on the input/output exceeds the first threshold voltage;
a fourth transistor coupled to a gate of the second transistor and the fourth transistor to be coupled to the input/output, wherein the fourth transistor is to conduct current when the voltage on the input/output is below the second threshold voltage;
a first resistor to be coupled between the third transistor and a first node to which the first threshold voltage is to be applied, wherein the first resistor is further to be coupled between the first transistor and the first node, and wherein the first resistor is to produce a first voltage drop from the first threshold voltage when the third transistor conducts current; and
a second resistor to be coupled between the fourth transistor and a second node to which the second threshold voltage is to be applied, wherein the second resistor is further to be coupled between the second transistor and the second node, and wherein the second resistor is to produce a second voltage drop from the second threshold voltage when the fourth transistor conducts current.

6. The input/output protection circuitry of claim 5, wherein:
the first transistor is to have the first threshold voltage applied to the gate of the first transistor; and
the second transistor is to have the second threshold voltage applied to the gate of the second transistor.

7. The input/output protection circuitry of claim 5, wherein:
the first threshold voltage is to be applied to a gate of the third transistor;
a source of the third transistor is to be coupled to the input/output;
the third transistor is to conduct current when the voltage on the input/output exceeds the first threshold voltage;
the second threshold voltage is to be applied to a gate of the fourth transistor;
a source of the fourth transistor is to be coupled to the input/output; and
the third transistor is to conduct current when a voltage at the source of the fourth transistor exceeds the second threshold voltage.

8. A radio frequency (RF) circuit, comprising:
electrostatic discharge protection circuitry coupled to an input/output of the RF circuit, the electrostatic discharge protection circuitry to protect the RF circuit from electrostatic discharge on the input/output; and
overdrive protection circuitry coupled to the input/output, the overdrive protection circuitry to protect the RF circuit from overdrive on the input/output, wherein the overdrive protection circuitry comprises:
a first transistor coupled to the input/output, the first transistor to discharge a positive overdrive on the input/output when a voltage applied to the input/output exceeds a first threshold voltage; and
a second transistor coupled to the input/output, the second transistor to discharge a negative overdrive on the input/output when the voltage applied to the input/output is below a second threshold voltage.

9. The RF circuit of claim 8, further comprising a termination resistor coupled between the input/output and a common mode node.

10. The RF circuit of claim 8, wherein:
a back gate of the first transistor is coupled to a back gate of the second transistor;
a first diode feature of the first transistor and a first diode feature of the second transistor is to provide electrostatic discharge protection for positive electrostatic discharge based on the back gate of the first transistor being coupled to the back gate of the second transistor; and
a second diode feature of the first transistor and a second diode feature of the second transistor is to provide electrostatic discharge protection for negative electrostatic discharge based on the back gate of the first transistor being coupled to the back gate of the second transistor.

11. The RF circuit of claim 10, wherein:
the first transistor and the second transistor share a deep n-well; and
junctions of an n-well of the first transistor with the deep n-well and of a p-well of the second transistor with the deep n-well form the first diode feature of the first transistor, the first diode feature of the second transistor, the second diode feature of the first transistor, and the second diode feature of the second transistor.

12. The RF circuit of claim 8, wherein:
the first transistor is coupled between the input/output and a common mode node for the RF circuit, the common mode node to be set to a common node voltage for the RF circuit; and
the second transistor is coupled between the input/output and the common mode node.

13. The RF circuit of claim 12, wherein:
a gate of the first transistor is to receive the first threshold voltage, the first transistor to conduct current when the voltage applied to input/output exceeds the first threshold voltage; and
a gate of the second transistor is to receive the second threshold voltage, the second transistor to conduct current when the voltage applied to the input/output exceeds the second threshold voltage.

14. The RF circuit of claim 12, wherein:
the first transistor comprises a p-channel field effect transistor (FET);
a source of the p-channel FET is coupled to the input/output and a drain of the p-channel FET is coupled to the common mode node;
the second transistor comprises an n-channel FET; and
a source of the n-channel FET is coupled to the input/output and a drain of the n-channel FET is coupled to the common mode node.

15. The RF circuit of claim 12, wherein the electrostatic discharge protection circuitry comprises:
a first diode feature of the first transistor;
a first diode feature of the second transistor, the first diode feature of the first transistor coupled to the first diode feature of the second transistor via a back gate of the first transistor being coupled to a back gate of the second transistor, the first diode feature of the first transistor and the first diode feature of the second transistor to conduct current when a positive electrostatic discharge is applied to the input/output;
a second diode feature of the first transistor; and
a second diode feature of the second transistor, the second diode feature of the second transistor coupled to the second diode feature of the second transistor via the back gate of the first transistor being coupled to the back gate of the second transistor, the second diode feature of the second transistor and the second diode feature of the second transistor to conduct current when a negative electrostatic discharge is applied to the input/output.

16. The RF circuit of claim 15, wherein:
the first transistor and the second transistor share a deep n-well; and
the back gate of the first transistor and the back gate of the second transistor are coupled via the deep n-well.

17. The RF circuit of claim 12, wherein the overdrive protection circuitry further comprises:
a third transistor coupled to the input/output and to a gate of the first transistor, the third transistor to further facilitate discharge of the positive overdrive; and
a fourth transistor coupled to the input/output and a gate of the second transistor, the fourth transistor to further facilitate discharge of the positive overdrive.

18. The RF circuit of claim 17, wherein:
a source of the third transistor is coupled to the input/output and a drain of the third transistor is coupled a first node to which the first threshold voltage is applied, the first transistor to discharge the positive overdrive to the common mode node and the third transistor to discharge the positive overdrive to the first node; and
a source of the fourth transistor is coupled to the input/output and a drain of the fourth transistor is coupled to a second node to which the second threshold voltage is applied, the second transistor to discharge the negative overdrive to the common mode node and the fourth transistor to discharge the negative overdrive to the second node.

19. The RF circuit of claim 12, wherein the RF circuit comprises an RF sampling analog-to-digital converter.

20. The RF circuit of claim 19, wherein the input/output is single-ended.

* * * * *

UNITED STATES PATENT AND TRADEMARK OFFICE
CERTIFICATE OF CORRECTION

PATENT NO. : 11,764,204 B2
APPLICATION NO. : 16/905687
DATED : September 19, 2023
INVENTOR(S) : Ralph D. Moore et al.

Page 1 of 1

It is certified that error appears in the above-identified patent and that said Letters Patent is hereby corrected as shown below:

In the Claims

In Column 41, Line 6, in Claim 1, after "circuitry" insert --for a device,--.

In Column 41, Line 57, in Claim 5, after "circuitry" insert --for a device,--.

Signed and Sealed this
Twenty-fourth Day of September, 2024

Katherine Kelly Vidal
*Director of the United States Patent and Trademark Office*